United States Patent [19]
Hosoya et al.

[11] Patent Number: 5,317,216
[45] Date of Patent: May 31, 1994

[54] ACTIVE FILTER CIRCUIT

[75] Inventors: Nobukazu Hosoya, Nara; Katsunori Miura, Shijonawate; Toru Sasaki, Matsubara, all of Japan

[73] Assignee: Sanyo Electric Co., Ltd., Osaka, Japan

[21] Appl. No.: 515,021

[22] Filed: Apr. 19, 1990

[30] Foreign Application Priority Data

| Apr. 20, 1989 [JP] | Japan | 1-100767 |
| Sep. 28, 1989 [JP] | Japan | 1-252578 |
| Sep. 28, 1989 [JP] | Japan | 1-252579 |

[51] Int. Cl.$^5$ .......................... H03B 1/00; H03K 5/00
[52] U.S. Cl. .................................... 307/521; 307/520; 328/167; 330/306
[58] Field of Search .............. 307/520, 521, 522, 523; 328/167; 333/172, 167; 330/306, 303

[56] References Cited

U.S. PATENT DOCUMENTS

| 3,969,682 | 7/1976 | Rossum | 330/306 |
| 4,377,759 | 3/1983 | Ohhata et al. | 307/520 |
| 4,812,773 | 3/1989 | Yamamoto et al. | 307/520 |
| 4,818,903 | 4/1989 | Kawano | 307/521 |
| 4,829,268 | 5/1989 | Leuthold et al. | 307/520 |
| 4,839,542 | 6/1989 | Robinson | 307/520 |
| 4,851,718 | 7/1989 | Hagino et al. | 307/529 |
| 4,851,719 | 7/1989 | Hitomi | 307/521 |
| 4,859,881 | 8/1989 | Yamamoto et al. | 328/167 X |
| 4,968,901 | 11/1990 | Shacter | 307/494 |
| 5,023,491 | 6/1991 | Koyama | 307/521 |

FOREIGN PATENT DOCUMENTS

3803179A1  2/1988  Fed. Rep. of Germany .

OTHER PUBLICATIONS

"A Fully Integrated Filter Circuit For VCRs", T. Fukuda et al, IEEE Transactions on Consumer Electronics, vol. CE-32, No. 3, Aug. 1986, pp. 644–650, New York.

"Automatically Tuned Filter Uses IC Operational Amplifiers", G. J. DeBoo et al, EDN/EEE, vol. 17, No. 3, Feb. 1, 1972, pp. 38–41, Denver, Colorado.

Denshi Gijjutsu vol. 22 No. 4 (Apr. 1980) Published by Nikkan Kogyo Shinbun Sha.

Primary Examiner—William L. Sikes
Assistant Examiner—Toan Tran
Attorney, Agent, or Firm—Nikaido, Marmelstein, Murray & Oram

[57] ABSTRACT

An active filter circuit includes a first and second differential pairs each having a pair of transistors. A capacitor is connected to a collector of one transistor from each of the first and second differential pairs. A first and second negative feed-back paths are connected, respectively, between the collector and a base of one transistor of the first differential pair and between the collector of one transistor of the second differential pair and a base of the other transistor of the first differential pair. By applying suitable voltages to respective inputs of the differential pairs, the active filter circuit functions as a band-pass filter, lowpass filter, high-pass filter, band elimination filter or phase-shifting filter with the same circuit configuration. A current mirror circuit correlatively changes current amounts of the first and second differential pairs in response to a control voltage, whereby a filter characteristic can be changed.

21 Claims, 16 Drawing Sheets

F I G.17
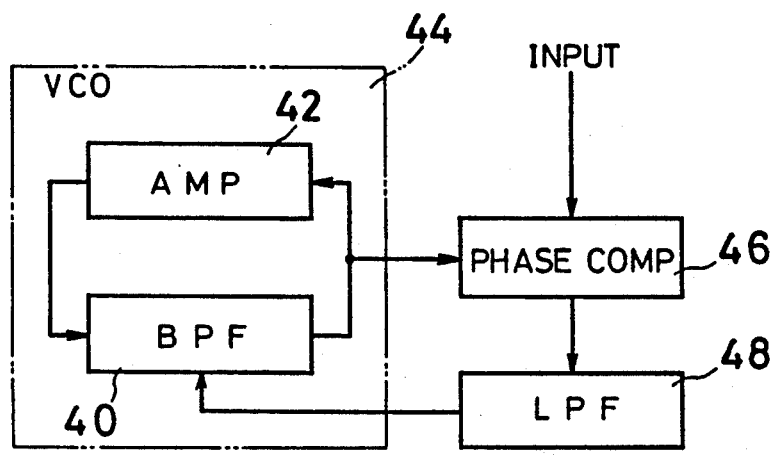
F I G.18
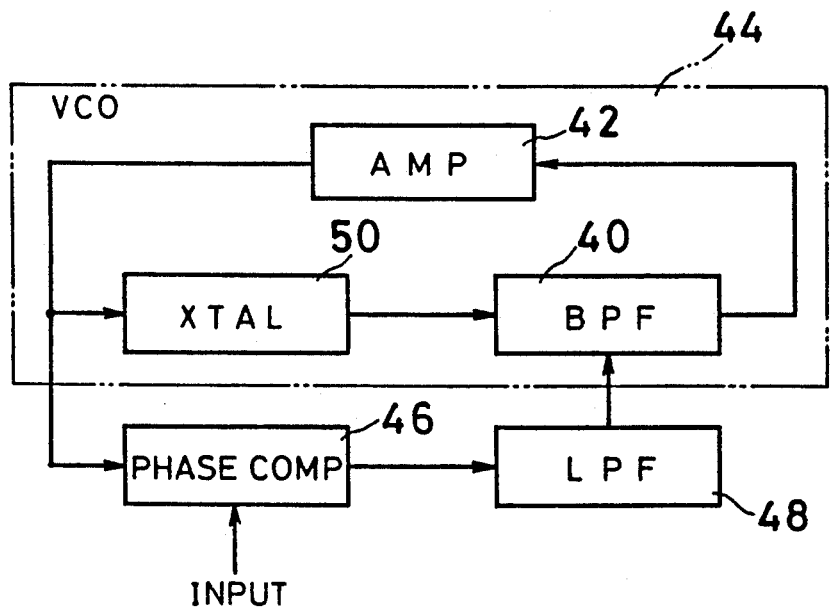

ACTIVE FILTER CIRCUIT

BACKGROUND OF THE INVENTION

1. Field of the Invention

The present invention relates to an active filter circuit. More specifically, the present invention relates to an active filter circuit suitable for an integration circuit (IC).

2. Description of the Prior Art

In a case where a filter is to be incorporated in an integrated circuit, due to variations of elements in the IC, a fluctuation takes place in a filter characteristic. Conventionally, in order to compensate for such a fluctuation, there was one method in which a dummy reference filter is provided in the IC and a reference signal is input thereto, and a feed-back control is applied to the reference filter so that a value of an output of the reference filter becomes a desired value. Based upon an idea that since a filter to be controlled comprises resistors and capacitors being the same as or correlative to that of the reference filter and therefore, a filter characteristic of the filter to be controlled can be adjusted to the same as or correlative to the characteristic of the reference filter if and when the same or correlative control signal is applied thereto, this method is a method for controlling the other filter to be controlled within the IC.

A prior art shown in FIG. 1 is one example of a case where a cut-off frequency fc of a lowpass filter is automatically controlled. First, a reference signal having a predetermined reference frequency Fref is input to a reference filter, and a level of a signal that is obtained by amplifying an output of the reference filter is compared with an output level of a reference frequency signal oscillator, a control voltage Vc by which both the levels are become coincident with each other is out, and the control voltage is applied to a variable capacitance diode Cv so that the filter characteristic is changed. By applying this feed-back control, when an attenuation amount at the reference frequency in the filter becomes equal to a gain of the amplifier, both levels becomes equal to each other and thus the filter is brought into an adjusted state.

In the conventional method shown in FIG. 1, it is not necessary to apply a signal externally to adjust the filter incorporated in the IC; however, since a dummy reference filter is to be provided in the IC, not only the number of elements in the IC increases but also the reference signal oscillator is needed.

One example of a filter circuit suitable for an IC is disclosed in, for example, Japanese Patent Publication No. 61-55860 published on Nov. 29, 1986.

In a filter circuit disclosed in Japanese Patent Publication No. 61-55806, in order to implement a high-pass filter circuit, it is necessary to add a subtracter, and therefore, there was a problem that not only the number of circuit components increases but also a circuit configuration becomes complex.

SUMMARY OF THE INVENTION

Therefore, a principal object of the present invention is to provide a novel active filter circuit.

Another object of the present invention is to provide an active filter circuit having a simple circuit configuration and suitable for an IC.

The other object of the present invention is to provide various kinds of filter controlling circuits which utilize such a novel active filter circuit.

An active filter circuit in accordance with the present invention comprises: a first differential pair constructed to include a first and second transistors; a first capacitive load connected to an output of the second transistor of the first differential pair; a first negative feed-back path for feeding-back an output of the second transistor to an input thereof; a second differential pair constructed to include a third and fourth transistors; a second capacitive load connected to an output of the fourth transistor of the second differential pair; and a second negative feed-back path for feeding-back an output of the fourth transistor to an input of the first transistor constituting the first differential pair.

In this invention, by the first and second negative feed-back paths, both of the first and second differential pairs operate in the vicinity of a center of a linear region thereof, and therefore, the first and second differential pairs cooperates to function as a secondary active filter circuit.

In another aspect, an active filter circuit in accordance with the present invention comprises: a first differential pair constructed to include a first and second transistors of first capacitive load connected to an output of the second transistor of the first differential pair; a second differential pair constructed to include a third and fourth transistors; a connecting path for connecting an output of the second transistor of the first differential pair to an input of the fourth transistor of the second differential pair; a second capacitive load connected to an output of the fourth transistor; and a negative feed-back path for feeding-back an output of the fourth transistor to an input of the first transistor constituting the first differential pair.

In this aspect, by the connecting path and the negative feed-back path, both of the first and second differential pairs operate in the vicinity of a center of a linear region thereof, and therefore, the first and second differential pairs cooperate to function as a secondary active filter circuit.

In accordance with the present invention, since it is not necessary to provide additional circuits such as a subtracter and etc., it is possible to obtain an active filter circuit suitable for an IC without the increase of the number of circuit components and the complication of the circuit configuration.

Furthermore, in accordance with the present invention, since different kinds of filters can be constructed by the same circuit configuration, respective filters are very correlative with each other, and therefore, it is possible to adjust the filters very easy.

The objects and other objects, features, aspects and advantages of the present invention will become more apparent from the following detailed description of the embodiments of the present invention when taken in conjunction with accompanying drawings.

BRIEF DESCRIPTION OF THE DRAWINGS

FIG. 17 is a block diagram showing an embodiment of a phase locked loop (PLL) which utilizes an active filter circuit in accordance with the present invention.

FIG. 18 and FIG. 19 are block diagrams respectively showing modified examples in each of which a crystal filter is added to FIG. 17 embodiment.

DETAIL DESCRIPTION OF THE PREFERRED EMBODIMENTS

Prior to a description of specific active filter circuits in accordance with the present invention, first, a differential pair, which includes a pair of transistors and which can be utilized as active filter circuits, will be described.

Figure 1:
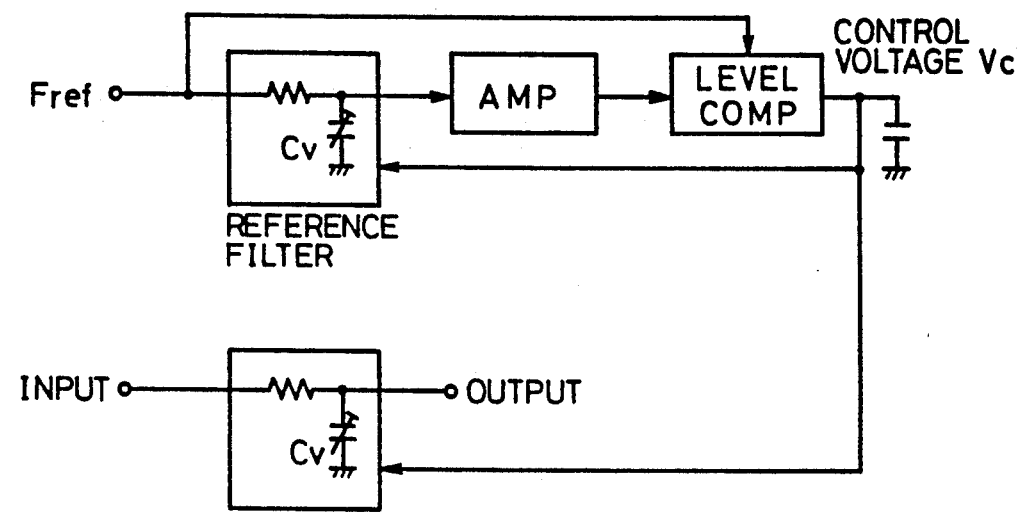
FIG. 1 is a circuit diagram showing a conventional method for automatically controlling a cut-off frequency of a lowpass filter.
Figure 2A:
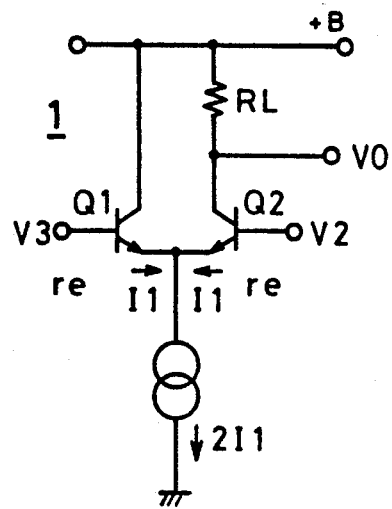
FIG. 2A to FIG. 2C are circuit diagrams showing differential pairs which can be utilized in the present invention.

In a differential pair 1 composed of transistors Q1 and Q2 as shown in FIG. 2A, assuming that a load resistor is RL, a collector voltage V0 of the transistor Q2 is represented by the following equation (1);

$$V0 = gm \cdot RL \cdot (V3 - V2) \quad (1)$$

where gm is a mutual conductance.

Assuming that a charge of an electron is q, Boltzmann's constant is k, a current is I1, and an absolute temperature is T, a relationship represented by the following equation (2) is established.

$$gm = \frac{q \cdot (2I1)}{4kT} = \frac{qI1}{2kT} \quad (2)$$

In addition, an emitter resistor, that is, differential resistor re of each of the transistors Q1 and Q2 constituting the differential pair 1 is given by the following equation (3).

$$re = \frac{kT}{qI1} = \frac{1}{2gm} \quad (3)$$

Therefore, the above equation (1) can be modified as the following equation (4).

$$V0 = \frac{1}{2re} \cdot RL \cdot (V3 - V2) \quad (4)$$

Figure 2B:
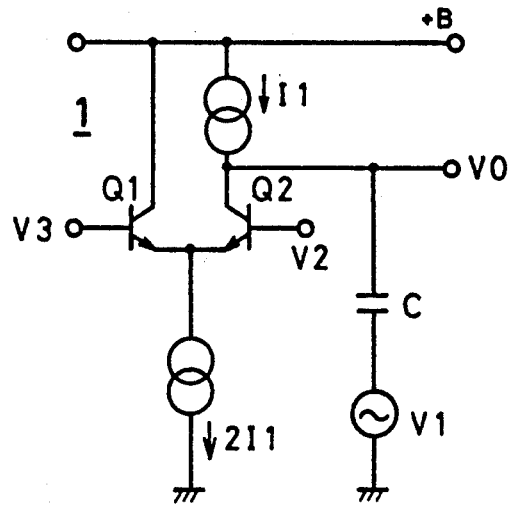

Next, as shown in FIG. 2B, if the load resistor RL is replaced with a constant current source having a current amount of I1 and a capacitor C which serves as a capacitive load is connected to a collector of the transistor Q2, since an impedance of the constant current source can be regarded as infinity and an impedance $1/j\omega C$ due to the capacitor C is corresponding to the load resistor RL, the equation (4) can be modified as the following equation (5).

$$V0 = \frac{1}{2re} \cdot \frac{1}{j\omega C} \cdot (V3 - V2) \quad (5)$$

Now, as shown in FIG. 2B, if a voltage source having an output voltage of V1 is further connected between the capacitor C and the ground, the following equation (6) is obtainable.

$$V0 = \frac{1}{2re} \cdot \frac{1}{j\omega C} \cdot (V3 - V2) + V1 \quad (6)$$

Figure 2C:
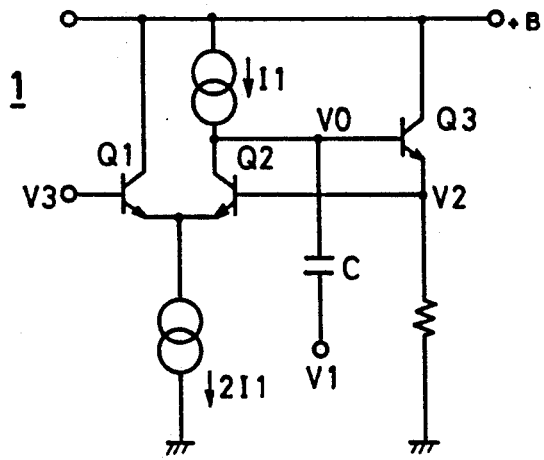

Next, as shown in FIG. 2C, when a emitter follower is constructed by a transistor Q3, and an emitter voltage of the transistor Q3 can be given by the following equation (7) because an input voltage and an output voltage are equal to each other in the emitter follower.

$$V2 = \frac{1}{2re} \cdot \frac{1}{j\omega C} \cdot (V3 - V2) + V1 \quad (7)$$

In the differential pair 1 as shown in FIG. 2B or 2C, a base input of the transistor Q1 serves as a plus (+) input and a base input of the transistor Q2 serves as a minus (−) input, and an output voltage is withdrawn from the collector of the transistor Q2. Therefore, in the example of FIG. 2C, the output voltage V0 is fed-back to the (−) input through the emitter follower Q3.

Figure 3:
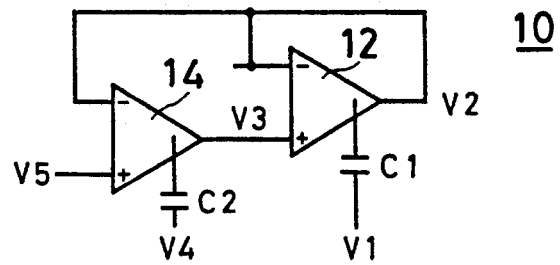
FIG. 3 is a circuit diagram showing one embodiment in accordance with the present invention.

With reference to FIG. 3, an active filter circuit 10 of this embodiment utilizes two differential pairs 12 and 14 each having the same configuration as that of the differential pair 1 described in FIG. 2A to 2C. An output voltage V3 of a second differential pair 14 is applied to a (+) input of a first differential pair 12 (corresponding to the base input of the transistor Q1 in FIG. 2C), and an output voltage V2 of the first differential pair 12 is fed-back to a (−) input thereof (corresponding to the base input of the transistor Q2 in FIG. 2C). Voltages V1 and V4 are respectively applied to capacitive loads of the differential pairs 12 and 14, that is, capacitors C1 and C2. To a (+) input of the second differential pair 14

(corresponding to the base input of the transistor Q1 in FIG. 2B), a voltage V5 is applied, and the output voltage V2 of the first differential pair 12 is fed-back to a (−) input thereof (corresponding to the base input of the transistor Q2 in FIG. 2B).

Figure 4:
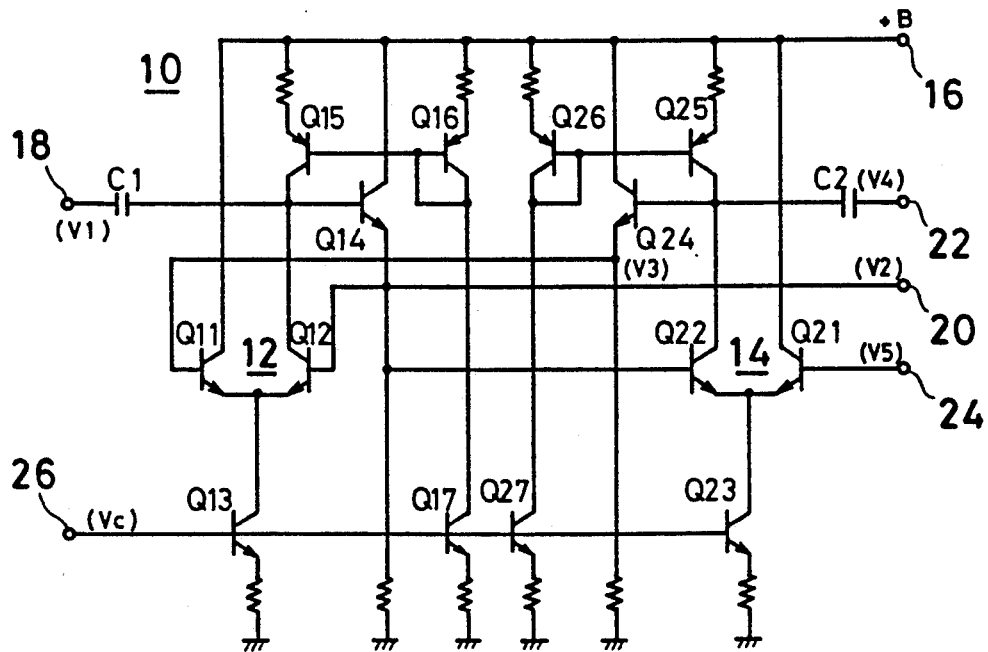
FIG. 4 is a circuit diagram showing FIG. 3 embodiment in detail.

The active filter circuit 10 shown in FIG. 3 is specifically shown in FIG. 4. With reference to FIG. 4, the active filter circuit 10 includes the first differential pair 12 constructed to include a first and second transistors Q11 and Q12, and the second differential pair 14 constructed to include a third and fourth transistors Q21 and Q22.

Emitters of the transistors Q11 and Q12 constituting the first differential pair 12 are commonly connected to a collector of a transistor Q13 constituting the above described constant current source. A collector of the transistor Q11 is supplied with a power source voltage (+B) from a terminal 16. A collector of the transistor Q12 is connected to a constant current source, that is, a collector of a transistor Q15 and a base of a transistor Q14 constituting the above described emitter follower of the first differential pair 12, which is also connected to a terminal 18 through the capacitor C1 constituting the capacitive load. To a base input of the transistor Q11 constituting the (+) input of the first differential pair 12 of FIG. 3, an output of a transistor Q24 constituting the above described emitter follower of the second differential pair 14 is connected, and a base input of the transistor Q12 constituting the (−) input is connected to the output of the transistor Q14, that is, a terminal 20. In addition, a current amount of the constant current source constructed by the transistor Q13 is set as 2I1 that is double a current amount I1 of the constant current source constructed by the transistor Q15.

Emitters of the transistors Q21 and Q22 constituting the second differential pair 14 are commonly connected to the above described constant current source constructed by a transistor Q23 which constitutes a current mirror circuit together with the previous transistor Q13. A collector of the transistor Q21 is applied with the power source voltage (+B) from the terminal 16. A collector of the transistor Q22 is connected to a constant current source constructed by a transistor Q25 and a base of a transistor Q24 as the emitter follower, which is also connected to a terminal 22 through the capacitor C2 that is the capacitive load. A base input of the transistor Q22 constituting the (−) input of the second differential pair 14 of FIG. 3 circuit is connected to the output of the first differential pair 12, that is, the terminal 20, and a base input of the transistor Q21 constituting the (+) input is connected to a terminal 24. In addition, as similar to the previously described first differential pair 12, in the second differential pair 14, a current amount of the constant current source constructed by the transistor Q25 is set as 2I2 that is double a current amount I2 of the constant current source constructed by the transistor Q25.

Transistors Q16 and Q26 are paired with each other, respective collectors of which are supplied with the power source voltage (+B) via suitable resistors. A collector of the transistor Q16 is connected to a base thereof and a constant current source constructed by a transistor Q17. Similarlily, a collector of the transistor Q26 is connected to a base thereof and a constant current source constructed by a transistor Q27.

In addition, the transistors Q13, Q23, Q17 and Q27 constituting the above described constant current sources are connected in parallel with each other to construct a current mirror circuit, and the bases thereof are commonly connected to a terminal 26. By applying a control voltage Vc to the terminal 26, current amounts of the respective transistors are changed, whereby a filter characteristic of this active filter circuit 10 can be adjusted or controlled.

Now, it is assumed that voltages at the terminal 18, the output of the transistor Q14, that is, the terminal 20, the output of the transistor Q24, the terminal 22 and the terminal 24 are respectively set as V1, V2, V3, V4 and V5.

When the voltage V5 at the terminal 24 increases, a collector current of the transistor Q22 decreases, and a current of the transistor Q24 increases by that decreased amount, and therefore, the output voltage V3 of the transistor Q24 increases. When the voltage V3 increases, a collector current of the transistor Q12 decreases, and a current of the transistor Q14 increases by that decreased amount, and therefore, the voltage V2 at the terminal 20 increases. When the voltage V2 increases, the decrease of the collector currents of the transistors Q12 and Q22 are suppressed so that operations of the first and second differential pairs 12 and 14 become stable. Therefore, each of the first and second differential pairs 12 and 14 always operates in the vicinity of a center of a linear region thereof, and therefore, no distortion of the signals occurs and a good filter characteristic is obtainable.

In the active filter circuit 10 shown in FIG. 4, on the assumption that the emitter resistor of each of the transistors Q11 and Q12 is re1, current I1 flowing each of the transistors Q11 and Q12 of the first differential pair 12 is given by the following equation (8).

$$I1 = \frac{V3 - V2}{2re1} \quad (8)$$

In addition, a signal voltage of the capacitor C1 is given by the following equation (9).

$$VC1 = \frac{1}{j\omega C1} \cdot I1 = V2 - V1 \quad (9)$$

Based upon the equations (8) and (9), in association with the first and second differential pairs 12 and 14 of the active filter circuit 10 shown in FIG. 4, the above described equation (7) is established, and therefore, the following equations (10) and (11) are obtainable;

$$\frac{V3 - V2}{2re1} \cdot \frac{1}{j\omega C1} = V2 - V1 \quad (10)$$

$$\frac{V5 - V2}{2re2} \cdot \frac{1}{j\omega C2} = V3 - V4 \quad (11)$$

where re2 is a differential resistor, that is, emitter resistor of each of the transistors Q21 and Q22 of the second differential pair 14.

In accordance with the above described equations (10) and (11), if the voltage V3 is eliminated while $j\omega = S$, the following equation (12) is obtained.

$$\frac{V5 - V2}{2re2} \cdot \frac{1}{SC2} + V4 - V2 = 2re1 \, SC1(V2 - V1) \quad (12)$$

$$V5 - V2 + 2re2 \, SC2(V4 - V2) = 4re1 \, re2 \, S^2 \, C1C2(V2 - V1)$$

$$V5 + 2re2 \, SC2V4 + 4re1 \, re2 \, S^2 \, C1C2V1 =$$

-continued $$V2 + 2re2\ SC2V2 + 4re1\ re2\ S^2\ C1C2V2$$

Now, if the terminals 18 and 22 are connected to ground and a signal is input to the terminal 24, $V1=V4=0$ and $V5=V$in are obtained, and therefore, a transfer function $T_{(s)}$ of the active filter circuit 10 of FIG. 4 is given by the following equation (13).

$$T_{(s)} = \frac{\frac{1}{4re1\ re2\ C1C2}}{S^2 + S\frac{2re2\ C2}{4re1\ re2\ C1C2} + \frac{1}{4re1\ re2\ C1C2}} \quad (13)$$

The equation (13) shows a secondary low-pass function. A cut-off frequency $\omega c$ thereof is given by the following equation (14) and Q is given by the following equation (15).

$$\omega o = \sqrt{\frac{1}{4re1\ re2\ C1C2}} = \frac{q}{2kT}\sqrt{\frac{I1I2}{C1C2}} \quad (14)$$

$$Q = \sqrt{\frac{re1\ C1}{re2\ C2}} = \sqrt{\frac{I2C1}{I1C2}} \quad (15)$$

Thus, the active filter circuit 10 of FIG. 4 is implemented as a secondary lowpass filter.

Similarly, when a signal is input to the terminal 18 and the terminals 22 and 24 are connected to the ground, $V1=V$in and $V4=V5=0$ are obtained, and therefore, a transfer function $T_{(s)}$ thereof is given by the following equation (16) which shows a secondary high-pass function. Then, a cut-off frequency $\omega c$ is given by the following equation (17) and Q is given by the following equation (18).

$$T_{(s)} = \frac{S^2}{S^2 + S\frac{2re2\ C2}{4re1\ re2\ C1C2} + \frac{1}{4re1\ re2\ C1C2}} \quad (16)$$

$$\omega c = \sqrt{\frac{1}{4re1\ re2\ C1C2}} = \frac{q}{2kT}\sqrt{\frac{I1I2}{C1C2}} \quad (17)$$

$$Q = \sqrt{\frac{re1\ C1}{re2\ C2}} = \sqrt{\frac{I2C1}{I1C2}} \quad (18)$$

Thus, the active filter circuit 10 of FIG. 4 is implemented as a secondary highpass filter.

In addition, if the terminals 18 and 24 are connected to ground a signal is input to the terminal 22, $V1=V5=0$ and $V4=V$in are obtained, and therefore, a secondary band-pass filter having a center frequency $\omega o$ and Q respectively represented by the following equations (19) and (20) is obtainable.

$$\omega o = \sqrt{\frac{1}{4re1\ re2\ C1C2}} = \frac{q}{2kT}\sqrt{\frac{I1I2}{C1C2}} \quad (19)$$

$$Q = \sqrt{\frac{re1\ C1}{re2\ C2}} = \sqrt{\frac{I2C1}{I1C2}} \quad (20)$$

In addition, if a signal is simultaneously input to the terminals 18 and 24 and the terminal 22 is connected to ground, $V1=V5=V$in and $V4=0$ are obtained, and therefore, it is possible to obtain a secondary band elimination filter having a center frequency $\omega o$ and Q respectively represented by the following equations (21) and (22).

$$\omega o = \sqrt{\frac{1}{4re1\ re2\ C1C2}} = \frac{q}{2kT}\sqrt{\frac{I1I2}{C1C2}} \quad (21)$$

$$Q = \sqrt{\frac{re1\ C1}{re2\ C2}} = \sqrt{\frac{I2C1}{I1C2}} \quad (22)$$

Furthermore, if a signal is simultaneously input to the terminals 18 and 24 and a signal reversed in phase is input to the terminal 22, $V1=V5=V$in and $V4=V$in are obtained, and therefore, it is possible to implement a secondary phase-shifting circuit having a center frequency $\omega o$, Q and a phase characteristic respectively represented by the following equations (23), (24) and (25).

$$\omega o = \sqrt{\frac{1}{4re1\ re2\ C1C2}} = \frac{q}{2kT}\sqrt{\frac{I1I2}{C1C2}} \quad (23)$$

$$Q = \sqrt{\frac{re1\ C1}{re2\ C2}} = \sqrt{\frac{I2C1}{I1C2}} \quad (24)$$

$$\arg T(j\omega) = -2\tan^{-1}\frac{\omega o\omega}{Q(\omega o^2 - \omega^2)} \quad (25)$$

Thus, in accordance with FIG. 4 embodiment, different kinds of secondary filter circuits can be implemented by the same circuit configuration. Therefore, in a case where a plurality of different kinds of filter circuits are incorporated within the same IC, if the control voltages Vc to be applied to the terminals 26 of the respective filters are linked with each other by adjusting only a single control voltage, it is possible to adjust all the filter circuits without any fluctuations.

Figure 5:
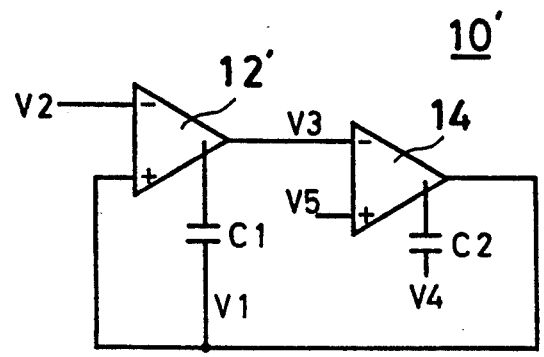
FIG. 5 is a circuit diagram showing another embodiment in accordance with the present invention.

With reference to FIG. 5, an active filter circuit 10' of this embodiment utilizes two differential pairs 12 and 14 each having the same configuration as that of the differential pair 1 described in FIG. 2A to 2C. A feed-back voltage V1 from a second differential pair 14 is applied to a (+) input of a first differential pair 12' (corresponding to the base input of the transistor Q1 in FIG. 2B), and a voltage V2 is applied to a (−) input thereof (corresponding to the base input of the transistor Q2 in FIG. 2B). Voltages V1 and V4 are respectively applied to capacitive loads of the differential pairs 12' and 14, that is, capacitors C1 and C2. To a (+) input of the second differential pair 14 (corresponding to the base input of the transistor Q1 in FIG. 2B), a voltage V5 is applied, and an output voltage V3 of the first differential pair 12' is applied to a (−) input thereof (corresponding to the base input of the transistor Q2 in FIG. 2B).

Figure 6:
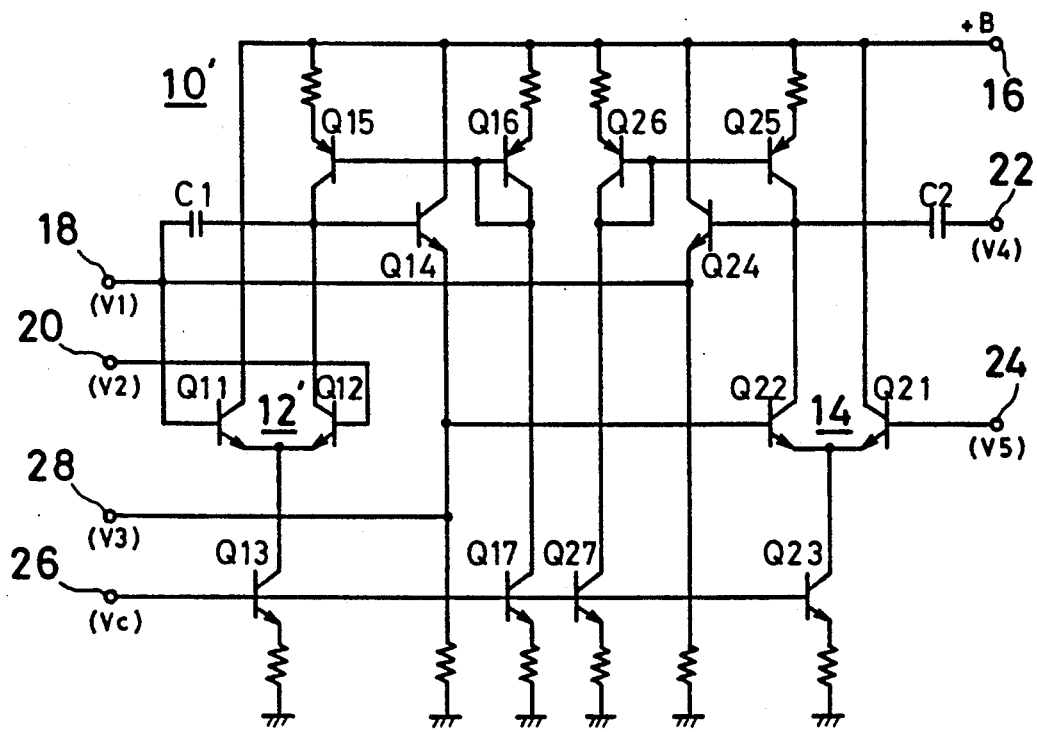
FIG. 6 is a circuit diagram showing FIG. 5 embodiment in detail.

The active filter circuit 10' of FIG. 5 is specifically shown in FIG. 6. The active filter circuit 10' of FIG. 6 is different from FIG. 4 embodiment in the following points. More specifically, in FIG. 4 embodiment, the negative feed-back path is formed between the output and the input of the transistor Q12 constituting the first differential pair 12. However, in the active filter circuit 10' of FIG. 6 embodiment, a base input (−input) of the transistor Q12 constituting the first differential pair 12' is connected to the terminal 20 and has no negative feed-back path. In addition, the output of the second differential pair 14 is connected to the terminal 18. However, since the remaining points of FIG. 6 embodiment are the same or similar to that of FIG. 4 embodiment, a duplicate description will be omitted here.

Now, it is assumed that voltages at the terminals 18, 20, 28, 22 and 24 are respectively set as V1, V2, V3, V4 and V5.

As similar to FIG. 4 embodiment, when the voltage V5 at the terminal 24 increases, a collector current of the transistor Q22 decreases, and a current of the transistor Q24 increases by that decreased amount, and therefore, the output voltage V1 of the transistor Q24 increases. When the voltage V1 increases, a collector current of the transistor Q12 decreases, and a current of the transistor Q14 increases by that decreased amount, and therefore, the voltage V2 at the terminal 20 increases. When the voltage V2 increases, the decrease of the collector currents of the transistors Q12 and Q22 are suppressed so that operations of the first and second differential pairs 12' and 14 become stable. Therefore, each of the first and second differential pairs 12' and 14 always operates in the vicinity of a center of a linear region thereof, and therefore, no distortion of the signals occurs and a good filter characteristic is obtainable.

In association with the first and second differential pairs 12' and 14 of the active filter circuit 10' shown in FIG. 6, by modifying the above described equation (7), the following equations (26) and (27) are obtainable.

$$\frac{V1 - V2}{2re1} \cdot \frac{1}{j\omega C1} = V3 - V1 \quad (26)$$

$$\frac{V5 - V3}{2re2} \cdot \frac{1}{j\omega C2} = V1 - V4 \quad (27)$$

In accordance with the above described equations (26) and (27), if the voltage V3 is eliminated while $j\omega = S$, the following equation (28) is obtained.

$$V5 - \left(\frac{V1 - V2}{2re1} \cdot \frac{1}{SC1} + V1\right) = 2re1\,SC1(V1 - V4) \quad (28)$$

$$V2 - V1 + 2re1\,SC1(V5 - V1) = 4re1\,re2\,S^2\,C1C2(V1 - V4)$$

$$V2 + 2re1\,SC1V5 + 4re1\,re2\,S^2\,C1C2V4 =$$

$$V1 + 2re1\,SC1V1 + 4re1\,re2\,S^2\,C1C2V1$$

Now, if the terminals 22 and 24 are connected to ground and a signal is input to the terminal 20, V4=V5=0 and V2=Vin are obtained, and therefore, a transfer function $T_{(s)}$ of the active filter circuit 10' of FIG. 6 is given by the following equation (29).

$$T_{(s)} = \frac{\frac{1}{4re1\,re2\,C1C2}}{S^2 + S\frac{2re1\,C1}{4re1\,re2\,C1C2} + \frac{1}{4re1\,re2\,C1C2}} \quad (29)$$

The equation (29) shows a secondary lowpass function. A cut-off frequency $\omega c$ thereof is given by the following equation (30) and Q is given by the following equation (31).

$$\omega c = \sqrt{\frac{1}{4re1\,re2\,C1C2}} = \frac{q}{2kT}\sqrt{\frac{I1I2}{C1C2}} \quad (30)$$

$$Q = \sqrt{\frac{re2\,C2}{re1\,C1}} = \sqrt{\frac{I1C2}{I2C1}} \quad (31)$$

Thus, the active filter circuit 10' of FIG. 6 is implemented as a secondary lowpass filter.

Similarly, when a signal is input to the terminal 22 and the terminals 20 and 24 are connected to ground, V4=Vin and V2=V5=0 are obtained, and therefore, a transfer function $T_{(s)}$ thereof is given by the following equation (32) which shows a secondary highpass function. Then, a cut-off frequency $\omega c$ is given by the following equation (33) and Q is given by the following equation (34).

$$T_{(s)} = \frac{S^2}{S^2 + S\frac{2re2\,C2}{4re1\,re2\,C1C2} + \frac{1}{4re1\,re2\,C1C2}} \quad (32)$$

$$\omega c = \sqrt{\frac{1}{4re1\,re2\,C1C2}} = \frac{q}{2kT}\sqrt{\frac{I1I2}{C1C2}} \quad (33)$$

$$Q = \sqrt{\frac{re2\,C2}{re1\,C1}} = \sqrt{\frac{I1C2}{I2C1}} \quad (34)$$

Thus, the active filter circuit 10' of FIG. 6 is implemented as a secondary highpass filter.

In addition, if the terminals 20 and 22 are connected to ground and a signal is input to the terminal 24, V2=V4=0 and V5=Vin are obtained, and therefore, a secondary band-pass filter having a center frequency $\omega o$ and Q respectively represented by the following equations (35) and (36) is obtainable.

$$\omega o = \sqrt{\frac{1}{4re1\,re2\,C1C2}} = \frac{q}{2kT}\sqrt{\frac{I1I2}{C1C2}} \quad (35)$$

$$Q = \sqrt{\frac{re2\,C2}{re1\,C1}} = \sqrt{\frac{I1C2}{I2C1}} \quad (36)$$

In addition, if a signal if simultaneously input to the terminals 20 and 22 and the terminal 24 is connected to the ground V2=V4=Vin and V5=0 are obtained, and therefore, it is possible to obtain a secondary band elimination filter having a center frequency $\omega o$ and Q respectively represented by the following equations (37) and (38).

$$\omega o = \sqrt{\frac{1}{4re1\,re2\,C1C2}} = \frac{q}{2kT}\sqrt{\frac{I1I2}{C1C2}} \quad (37)$$

$$Q = \sqrt{\frac{re2\,C2}{re1\,C1}} = \sqrt{\frac{I1C2}{I2C1}} \quad (38)$$

Furthermore, if a signal is simultaneously input to the terminals 20 and 22 and a signal reversed in phase is input to the terminal 24, V2=V4=Vin and V5=Vin are obtained, and therefore, it is possible to implement a secondary phase-shifting circuit having a center frequency $\omega o$, Q and a phase characteristic respectively represented by the following equations (39), (40) and (41).

$$\omega o = \sqrt{\frac{1}{4re1\, re2\, C1C2}} = \frac{q}{2kT}\sqrt{\frac{I1I2}{C1C2}} \qquad (39)$$

$$Q = \sqrt{\frac{re2\, C2}{re1\, C1}} = \sqrt{\frac{I1C2}{I2C1}} \qquad (40)$$

$$\arg T(j\omega) = -2\tan^{-1}\frac{\omega o\,\omega}{Q(\omega o^2 - \omega^2)} \qquad (41)$$

Thus, in accordance with FIG. 6 embodiment, different kinds of secondary filter circuits can be implemented by the same circuit configuration. Therefore, in a case where a plurality of different kinds of filter circuits are incorporated within the same IC, if the control voltages Vc to be applied to the terminals 26 of the respective filters are linked with each other by adgusting a single control valtage, it is possible to adjust all the filter circuits without any fluctuations.

Figure 7:
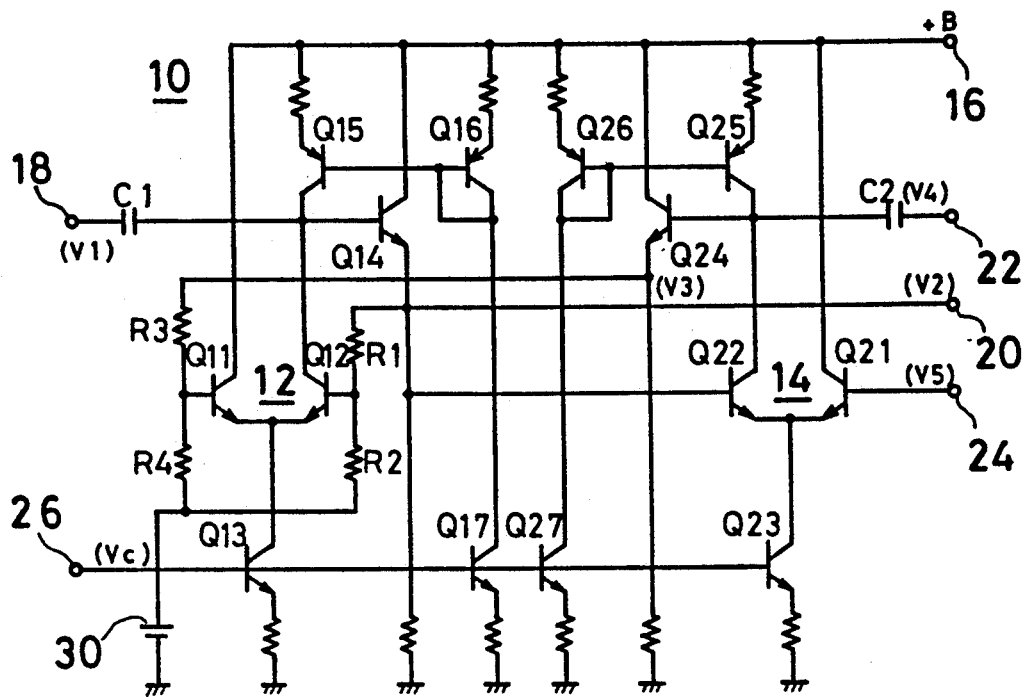
FIG. 7 is a circuit diagram showing a modified example of FIG. 4 embodiment.

An active filter circuit 10 as shown in FIG. 7 is a modification of FIG. 4 embodiment and thus the same or similar to FIG. 4 except for the following point. More specifically, the base of the above described transistor Q12 constituting the first differential pair 12 is connected to the emitter of the transistor Q14 constituting the emitter follower through a resistor R1 and a bias voltage 30 through a resistor R2. An output of the transistor Q12, that is, the transistor Q14 is thus fed-back to the base or input of the transistor Q12 through the resistor R1. In addition, the base of the transistor Q11 constituting the first differential pair 12 is connectd to the output of the transistor Q22 constituting the second differential pair 14, that is, the output of the emitter follower transistor Q24 through a resistor R3 and the above described bias voltage source 30 through a resistor R4.

In association with the first and second differential pairs 12 and 14 of the active filter circuit 10 shown in FIG. 7, by modifying the above described equation (7), the following equations (42) and (43) are obtainable;

$$\frac{KV3 - KV2}{2re1} \cdot \frac{1}{j\omega C1} = V2 - V1 \qquad (42)$$

$$\frac{V5 - V2}{2re2} \cdot \frac{1}{j\omega C2} = V3 - V4 \qquad (43)$$

where K is a constant (described later).

In accordnce with the above described equations (42) and (43), if the voltage V3 is eliminated while $j\omega = S$, the following equation (44) is obtained.

$$K\left(\frac{V5 - V2}{2re2}\cdot\frac{1}{SC2} + V4 - V2\right) = 2re1\, SC1(V2 - V1) \qquad (44)$$

$$V5 - V2 + 2re2\, SC2(V4 - V2) = \frac{1}{K}\, 4re1\, re2\, S^2\, C1C2(V2 - V1)$$

$$V5 + 2re2\, SC2\, V4 = V2 + 2re2\, SC2\, V2 + \frac{1}{K}\, 4re1\, re2\, S^2\, C1C2\, V2$$

$$K = \frac{R4}{R3 + R4} = \frac{R2}{R1 + R2}$$

Now, if the terminals 18 and 22 are connected to ground and a signal is input to the terminal 24, $V1 = V4 = 0$ and $V5 = Vin$ are obtained, and therefore, a transfer function $T_{(s)}$ of the active filter circuit 10 of FIG. 7 is given by the following equation (45).

$$T_{(s)} = \frac{\frac{K}{4re1\, re2\, C1C2}}{S^2 + S\frac{2re2\, C2\, K}{4re1\, re2\, C1C2} + \frac{K}{4re1\, re2\, C1C2}} \qquad (45)$$

The equation (45) shows a secondary lowpass function. A out-off frequency $\omega c$ thereof is given by the following equation (46) and Q is given by the following equation (47).

$$\omega c = \sqrt{\frac{K}{4re1\, re2\, C1C2}} = \frac{q}{2kT}\sqrt{\frac{I1I2}{C1C2}\cdot K} \qquad (46)$$

$$Q = \frac{1}{\sqrt{K}}\sqrt{\frac{re1\, C1}{re2\, C2}} = \frac{1}{\sqrt{K}}\sqrt{\frac{I2C1}{I1C2}} \qquad (47)$$

Thus, the active filter circuit 10 of FIG. 7 is implemented as a secondary lowpass filter.

Similarly, when a signal is input to the terminal 18 and the terminals 22 and 24 are connected to ground, $V1 = Vin$ and $V4 = V5 = 0$ are obtained, and therefore, a transfer function $T_{(s)}$ thereof is given by the following equation (48) which shows a secondary highpass function. Then, a cut-off frequency $\omega c$ is given by the following equation (49) and Q is given by the following equation (50).

$$T_{(s)} = \frac{\frac{K}{4re1\, re2\, C1C2}}{S^2 + S\frac{2re2\, C2\, K}{4re1\, re2\, C1C2} + \frac{K}{4re1\, re2\, C1C2}} \qquad (48)$$

$$\omega c = \sqrt{\frac{K}{4re1\, re2\, C1C2}} = \frac{q}{2kT}\sqrt{\frac{I1I2}{C1C2}\cdot K} \qquad (49)$$

$$Q = \frac{1}{\sqrt{K}}\sqrt{\frac{re1\, C1}{re2\, C2}} = \frac{1}{\sqrt{K}}\sqrt{\frac{I2C1}{I1C2}} \qquad (50)$$

Thus, the active filter circuit 10 of FIG. 7 is implemented as a secondary highpass filter.

In addition, if the terminals 18 and 24 are connected to ground and a signal is input to the terminal 22, $V1 = V5 = 0$ and $V4 = Vin$ are obtained, and therefore, a secondary band-pass filter having a center frequency $\omega o$ and Q respectively represented by the following equations (51) and (52) is obtainable.

$$\omega o = \sqrt{\frac{K}{4re1\, re2\, C1C2}} = \frac{q}{2kT}\sqrt{\frac{I1I2}{C1C2}\cdot K} \qquad (51)$$

$$Q = \frac{1}{\sqrt{K}}\sqrt{\frac{re1\, C1}{re2\, C2}} = \frac{1}{\sqrt{K}}\sqrt{\frac{I2C1}{I1C2}} \qquad (52)$$

In addition, if a signal is simultaneously input to the terminals 18 and 24 and the terminal 22 is connected to ground $V1 = V5 = Vin$ and $V4 = 0$ are obtained, and therefore, it is possible to obtain a secondary band elimination filter having a center frequency $\omega o$ and Q respectively represented by the following equations (53) and (54).

$$\omega o = \sqrt{\frac{K}{4re1\,re2\,C1C2}} = \frac{q}{2kT}\sqrt{\frac{I1I2}{C1C2}} \cdot K \quad (53)$$

$$Q = \frac{1}{\sqrt{K}}\sqrt{\frac{re1\,C1}{re2\,C2}} = \frac{1}{\sqrt{K}}\sqrt{\frac{I2C1}{I1C2}} \quad (54)$$

Furthermore, if a signal is simultaneously input to the terminals 18 and 24 and a signal reversed in phase is input to the terminal 22, V1=V5=Vin and V4=Vin are obtained, and therefore, it is possible to implement a secondary phase-shifting circuit having a center frequency ωo, Q and a phase characteristic respectively represented by the following equations (55), (56) and (57).

$$\omega o = \sqrt{\frac{K}{4re1\,re2\,C1C2}} = \frac{q}{2kT}\sqrt{\frac{I1I2}{C1C2}} \cdot K \quad (55)$$

$$Q = \frac{1}{\sqrt{K}}\sqrt{\frac{re1\,C1}{re2\,C2}} = \frac{1}{\sqrt{K}}\sqrt{\frac{I2C1}{I1C2}} \quad (56)$$

$$\arg T(j\omega) = -2\tan^{-1}\frac{\omega o\,\omega}{Q(\omega o^2 - \omega^2)} \quad (57)$$

Thus, in accordance with FIG. 7 embodiment, if the constant K determined by the resistors R1 to R4 of the base biases of the transistors Q11 and Q12, the above described respective filter characteristics can be modified, and it is further possible to adjust a filter characteristic by means of a control voltage Vc applied to the terminal 26.

Figure 8:
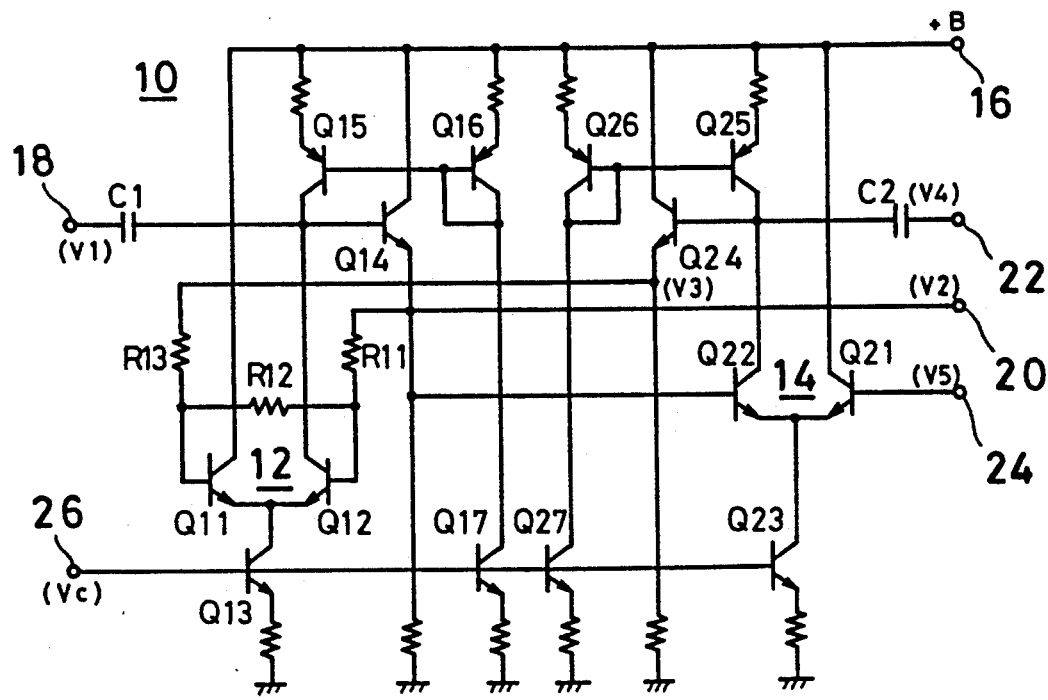
FIG. 8 is a circuit diagram showing a modified example of FIG. 7 embodiment.

FIG. 8 embodiment is a modification of FIG. 7 embodiment, and an active filter circuit 10 of FIG. 8 embodiment is different from FIG. 7 embodiment in the following points. More specifically, in FIG. 7 embodiment, the base of the transistor Q12 constituting the first differential pair 12 is connected to the emitter of the transistor Q14 through the resistor R1 and the bias voltage source 30 through the resistor R2, and the base of the transistor Q11 constituting the first differential pair 12 is connected to the emitter of the transistor Q24 through the resistor R3 and the bias voltage source 30 through the resistor R4. However, in the active filter circuit 10 of FIG. 8 embodiment, the bases of the transistors Q11 and Q12 constituting the first differential pair 12 are respectively connected to the emitters of the transistors Q14 and Q24 through resistors R11 and R13 and interconnected to each other through a resistor R12, which has no bias voltage source.

In FIG. 7 embodiment, the current I1 flowing the transistors Q11 and Q12 are exactly represented by the following equation (58).

$$I1 = \frac{\frac{R4}{R3+R4}V3 + \frac{R2}{R1+R2}V2}{2re1} \quad (58)$$

Assuming that R2/(R1+R2)=K1 and R4/(R3+R4)=K2, even if these resistors are arranged to be close to each other, a ratio of the resistors in the same IC has an error of approximately 2%, and therefore, a relative ratio of K1 and K2 bocomes to have an error of approximately 4%.

On the other hand, in FIG. 8 embodiment, assuming that the base voltages of respective transistors Q11 and Q12 are V11 and V12, V11 and V12 are respectively given by the following equations (59) and (60).

$$V11 = \frac{R11 + R12}{R11 + R12 + R13}V3 + \frac{R13}{R11 + R12 + R13}V2 \quad (59)$$

$$V12 = \frac{R12 + R13}{R11 + R12 + R13}V2 + \frac{R11}{R11 + R12 + R13}V3 \quad (60)$$

In FIG. 8, a current I1' flowing the transistors Q11 and Q12 is given by the following equation (61) as similar to the current I1 in FIG. 7.

$$\begin{aligned}I1' &= \frac{V11 - V12}{2re1} \quad (61)\\ &= \frac{(R11+R12)V3 + R13V2 - (R13+R12)V2 - R11V3}{(R11+R12+R13)\cdot 2re1}\\ &= \frac{\frac{R12}{R11+R12+R13}V3 - \frac{R12}{R11+R12+R13}V2}{2re1}\end{aligned}$$

As seen from the equation (61) coefficients of the voltages V3 and V2 are equal to each other, and therefore, no influence due to an error of the resistance ratio is affected and no bias voltage source is needed. In addition, when R11=R1, R13=R3 and R12=R2+R4, each of K1 and K2 becomes to be equal to K in FIG. 7.

Figure 9:
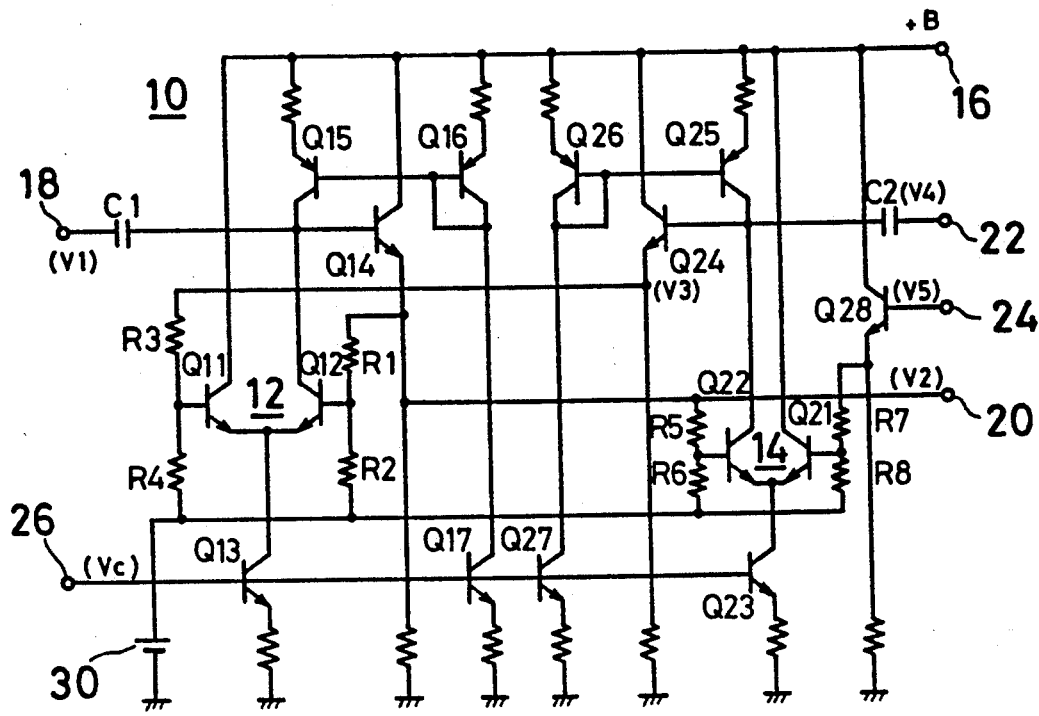
FIG. 9 is a circuit diagram showing a further modified example of FIG. 4 embodiment.

In addition, FIG. 9 embodiment is a modification of FIG. 7 embodiment, which is differs from FIG. 7 embodiment in that resistors R5 to R8 are connected in association with the transistors Q21 and Q22 of the second differential pair 14. In addition, a transistor Q28 constitutes an emitter follower.

In an active filter circuit 10 as shown in FIG. 9, assuming that an emitter resistor of each of the transistors Q11 and Q12 is re1, a current flowing respective one of the transistors Q11 and Q12 constituting the first differential pair is given by the following equation (62);

$$I1 = \frac{K2\,V3 - K1\,V2}{2re1} \quad (62)$$

where K1 and K2 are constants (described later).

A signal voltage VC1 of the capacitor C1 is given by the following equation (63).

$$VC1 = \frac{1}{j\omega C1}\cdot I1 = V2 - V1 \quad (63)$$

The following equation (64) is obtainable by the above described equations (62) and (63). Similarlily, in association with the second differential pair 14, the following equation (65) is obtainable.

$$\frac{K2V3 - K1V2}{2re1}\cdot\frac{1}{j\omega C1} = V2 - V1 \quad (64)$$

$$\frac{K4V5 - K3V2}{2re2}\cdot\frac{1}{j\omega C2} = V3 - V4 \quad (65)$$

In accordance with the above described equations (64) and (65), if the voltage V3 is eliminated while jω=S, the following equation (66) is obtained.

$$K2\left(\frac{K4V5 - K3V2}{2re2}\cdot\frac{1}{SC2} + V4\right)- \quad (66)$$

-continued $$K1V2 = 2re1\ SC1(V2 - V1)$$

$$K2K4V5 + K2 \cdot 2re2\ SC2V4 + 4re1\ re2\ S^2\ C1C2V1 =$$
$$K2K3V2 + K1 \cdot 2re2\ SC2V2 + 4re1\ re2\ S^2\ C1C2V2$$

$$K1 = \frac{R2}{R1 + R2}$$

$$K2 = \frac{R4}{R3 + R4}$$

$$K3 = \frac{R6}{R5 + R6}$$

$$K4 = \frac{R8}{R7 + R8}$$

Now, if a signal is simultaneously input to the terminals 18 and 20 and the terminal 22 is connected to ground, V1=V5=Vin and V4=0 are obtained, and therefore, a transfer function $T_{(s)}$ of the active filter circuit 10 of FIG. 9 is given by the following equation (67).

$$T_{(s)} = \frac{S^2 + \frac{K2K4}{4re1\ re2\ C1C2}}{S^2 + S\frac{K1 \cdot 2re2\ C2}{4re1\ re2\ C1C2} + \frac{K2K3}{4re1\ re2\ C1C2}} \quad (67)$$

The equation (67) shows a secondary lowpass and band elimination function. A cut-off frequency ωc thereof is given by the following equation (68), Q is given by the following equation (69) and a center frquency ωN of the band elimination is given by the following equation (70).

$$\omega c = \sqrt{\frac{K2K3}{4re1\ re2\ C1C2}} = \frac{q}{2kT} \sqrt{\frac{I1I2}{C1C2} \cdot K2K3} \quad (68)$$

$$Q = \sqrt{\frac{K2K3}{K1^2} \cdot \frac{re1\ C1}{re2\ C2}} = \sqrt{\frac{K2K3}{K1^2} \cdot \frac{I2C1}{I1C2}} \quad (69)$$

$$\omega N = \sqrt{\frac{K2K4}{4re1\ re2\ C1C2}} = \frac{q}{2kT} \sqrt{\frac{I1I2}{C1C2} \cdot K2K4} \quad (70)$$

In a case of ωN>ωc, the active filter circuit shown in FIG. 9 becomes as a lowpass and band elimination filter (lowpass notch filter) and in a case of ωN<ωc, the same becomes as a highpass and band elimination filter (highpass notch filter).

In a case where K1=K2 and K3=K4, as similar to the previously described embodiments, it is possible to implement a lowpass filter, band-pass filter, band elimination filter or phase-shifting filter circuit.

In FIG. 9 embodiment, as seen from the above equations (68) and (70), a lowpass notch filter or a highpass notch filter can be implemented by making values of K3 and K4 different from each other. However, in FIG. 7 embodiment, as seen from the circuit diagram thereof and the aforementioned equation (44), since the signal input to the second differential pair 14 is not divided, it is impossible to implement such a lowpass notch filter or highpass notch filter.

Figure 10:
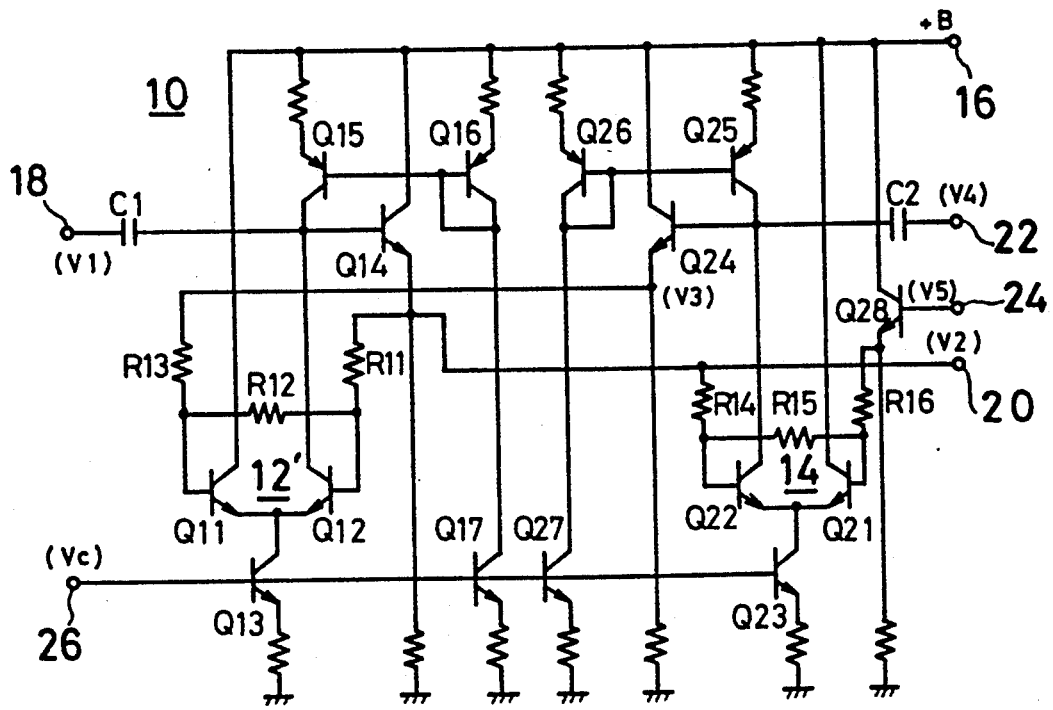
FIG. 10 is a circuit diagram showing a modified example of FIG. 9 embodiment.

FIG. 10 embodiment is an example in which the same change as the first differential pair 12 in FIG. 8 embodiment is applied to the second differential pair 14 by means of resistors R14 to R16, and it is possible to obtain an advantage that no influence due to an error of the resistance ratio is affected, as similar to the aforementioned FIG. 8 embodiment.

Figure 11:
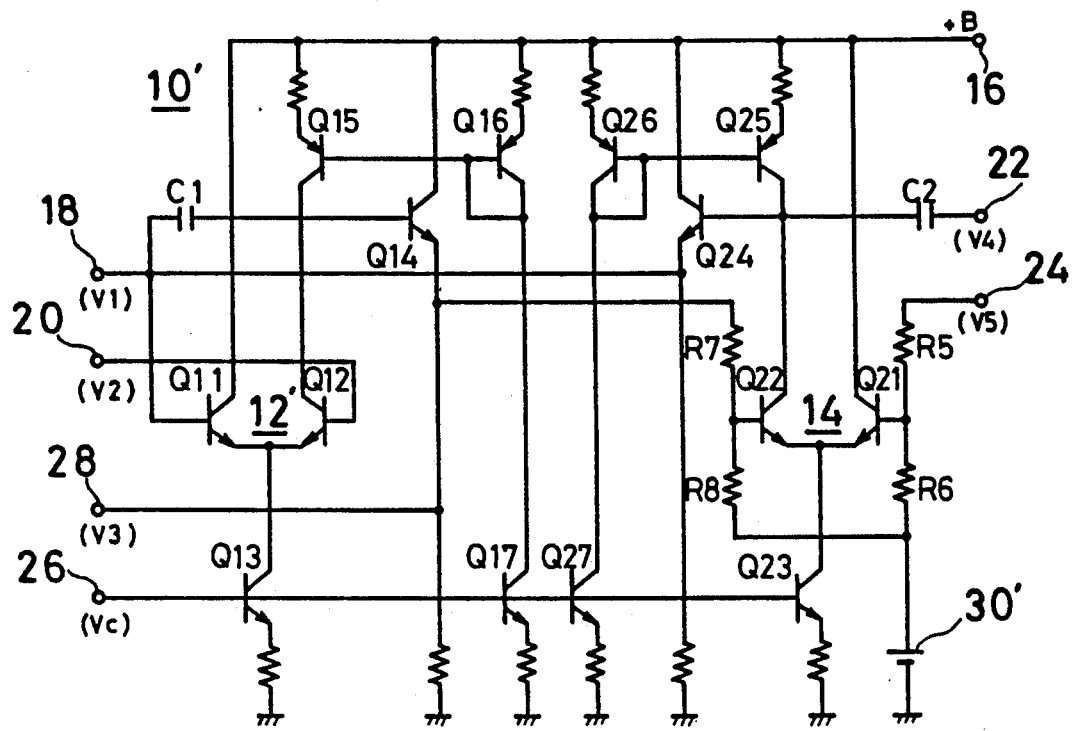
FIG. 11 is a circuit diagram showing a modified example of FIG. 6 embodiment.

FIG. 11 embodiment is a modification of FIG. 6 embodiment, wherein the same change as the first differential pair 12 in FIG. 7 embodiment is applied to the second differential pair 14.

In FIG. 11 embodiment, the aforementioned equation (28) is modified as the following equation (71).

$$V2 + 2re1\ SC1V4 + 4re1\ re2\ S^2\ C1C2 \cdot - V5\frac{1}{K} = V1 + \quad (71)$$
$$2re1\ SC1V1 + 4re1\ re2\ S^2\ C1C2 \cdot - V1\frac{1}{K}$$

$$K = \frac{R6}{R5 + R6} = \frac{R8}{R7 + R8}$$

Now, if the terminals 22 and 24 are connected to ground and a signal is input to the terminal 20, V1=V4=0 and V5=Vin are obtained, and therefore, a transfer function $T_{(s)}$ of the active filter circuit 10' of FIG. 11 is given by the following equation (72).

$$T_{(s)} = \frac{\frac{K}{4re1\ re2\ C1C2}}{S^2 + S\frac{2re1\ C1\ K}{4re1\ re2\ C1C2} + \frac{K}{4re1\ re2\ C1C2}} \quad (72)$$

The equation (72) shows a secondary lowpass function. A cut-off frequency ωc thereof is given by the following equation (73) and Q is given by the following equation (74).

$$\omega c = \sqrt{\frac{K}{4re1\ re2\ C1C2}} = \frac{q}{2kT} \sqrt{\frac{I1I2}{C1C2} \cdot K} \quad (73)$$

$$Q = \frac{1}{\sqrt{K}} \sqrt{\frac{re2\ C2}{re1\ C1}} = \frac{1}{\sqrt{K}} \sqrt{\frac{I1C2}{I2C1}} \quad (74)$$

Thus, the active filter circuit 10' of FIG. 11 is implemented as a secondary lowpass filter.

In addition, it is possible to implement a highpass filter, band-pass filter, band elimination filter or phase-shifting filter by FIG. 11 circuit, however, respective characteristics thereof can be easily understood from the above description, and therefore, more detail descriptions will be omitted here.

Figure 12:
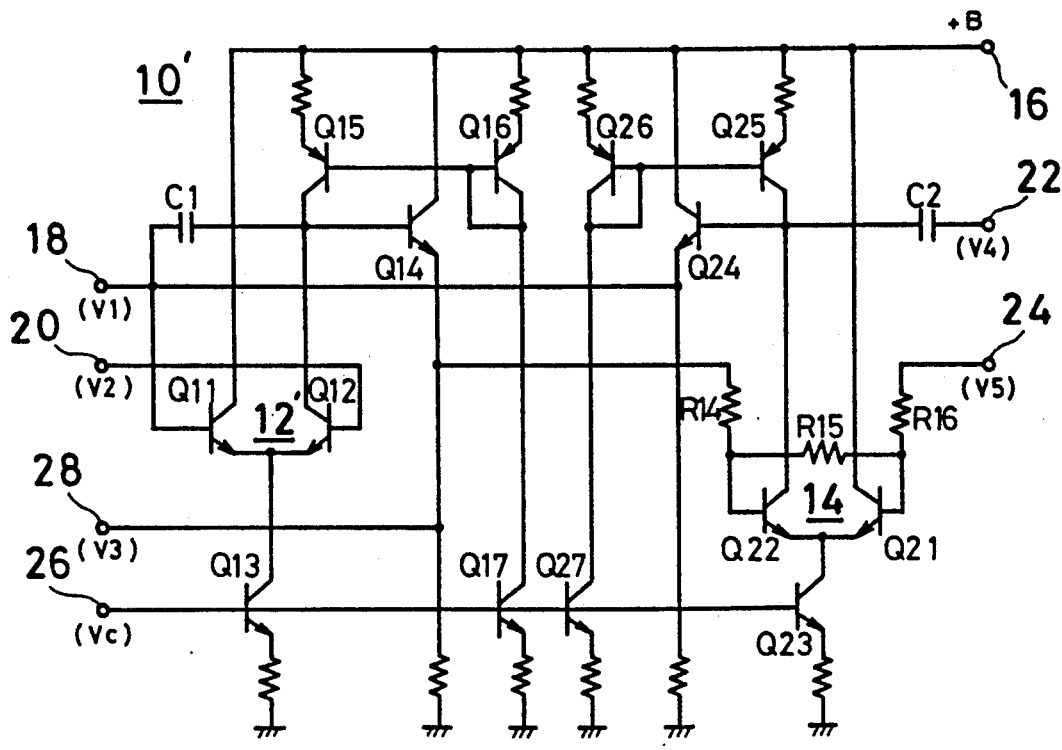
FIG. 12 is a circuit diagram showing a modified example of FIG. 11 embodiment.

FIG. 12 is an embodiment in which the same change as the first differential pair 12 of FIG. 8 is applied to the second differential pair 14.

Figure 13:
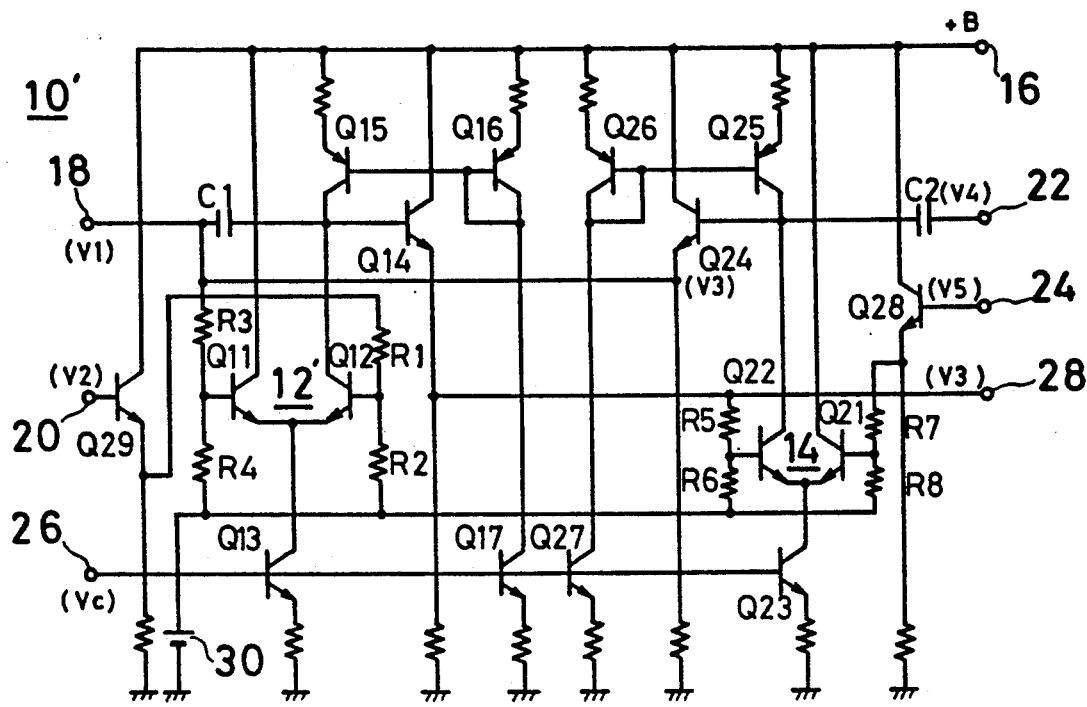
FIG. 13 is a circuit diagram showing a further modified example of FIG. 6 embodiment.

FIG. 13 embodiment is an embodiment wherein the same change of the second differential pair 14 in FIG. 11 embodiment is applied to the first differential pair 12' of FIG. 11 embodiment, too.

More specifically, FIG. 13 embodiment is a modification of FIG. 11 embodiment, as similar to the equations (26) and (27), the following equations (75) and (76) are obtainable.

$$\frac{K4V5 - K3V3}{2re2} \cdot \frac{1}{j\omega C2} = V1 - V4 \quad (76)$$

$$\frac{K2V1 - K1V2}{2re1} \cdot \frac{1}{j\omega C1} = V3 - V1 \quad (75)$$

In accordance with the above described equations (75) and (76), if the voltage V3 is eliminated while $j\omega = S$, the following equation (77) is obtained.

$$K1K3V2 + K4 \cdot 2re1\ SC1V5 + 4re1\ re2\ S^2\ C1C2V4 = \qquad (77)$$
$$K2K3V1 + K3 \cdot 2re1\ SC2V1 + 4re1\ re2\ S^2\ C1C2V1$$

$$K1 = \frac{R2}{R1 + R2}$$

$$K2 = \frac{R4}{R3 + R4}$$

$$K3 = \frac{R6}{R5 + R6}$$

$$K4 = \frac{R8}{R7 + R8}$$

Now, if a signal is simultaneously input to the terminals 20 and 22 and the terminal 24 is connected to ground, V2=V4=Vin and V5=0 are obtained, and therefore, a transfer function T(s) of the active filter circuit 10' of FIG. 13 is given by the following equation (78).

$$T_{(s)} = \frac{S^2 + \frac{K1K3}{4re1\ re2\ C1C2}}{S^2 + S\frac{K3 \cdot 2re1\ C1}{4re1\ re2\ C1C2} + \frac{K2K3}{4re1\ re2\ C1C2}} \qquad (78)$$

The equation (78) shows a secondary lowpass and band elimination function. A cut-off frequency $\omega c$ thereof is given by the following equation (79), Q is given by the following equation (80) and a center frequency of the band elimination is given by the following equation (81).

$$\omega c = \sqrt{\frac{K2K3}{4re1\ re2\ C1C2}} = \frac{q}{2kT}\sqrt{\frac{I1I2}{C1C2} \cdot K2K3} \qquad (79)$$

$$Q = \sqrt{\frac{K2K3}{K3^2} \cdot \frac{re1\ C1}{re2\ C2}} = \sqrt{\frac{K2}{K3} \cdot \frac{I1C1}{I2C2}} \qquad (80)$$

$$\omega_N = \sqrt{\frac{K1K3}{4re1\ re2\ C1C2}} = \frac{q}{2kT}\sqrt{\frac{I1I2}{C1C2} \cdot K1K3} \qquad (81)$$

In a case of $\omega_N > \omega c$, the active filter circuit 10' shown in FIG. 13 becomes as a lowpass and band elimination filter (lowpass notch filter) and in a case of $\omega_N < \omega c$, the same becomes as a highpass and band elimination filter (hightpass notch filter).

In a case where K1=K2 and K3=K4, as similar to FIG. 6 embodiment, it is possible to implement a lowpass filter, band-pass filter, band elimination filter or phase-shifting filter circuit.

In FIG. 13 embodiment, as seen from the above equations (79) and (81), a lowpass notch filter or a highpass notch filter can be implemented by making values of K1 and K2 different from each other. However, in FIG. 11 embodiment, as seen from the circuit diagram thereof and the aforementioned equation (39), since the signal input to the second differential pair 14 is not divided, it is impossible to implement such a lowpass notch filter or highpass notch filter.

Figure 14:
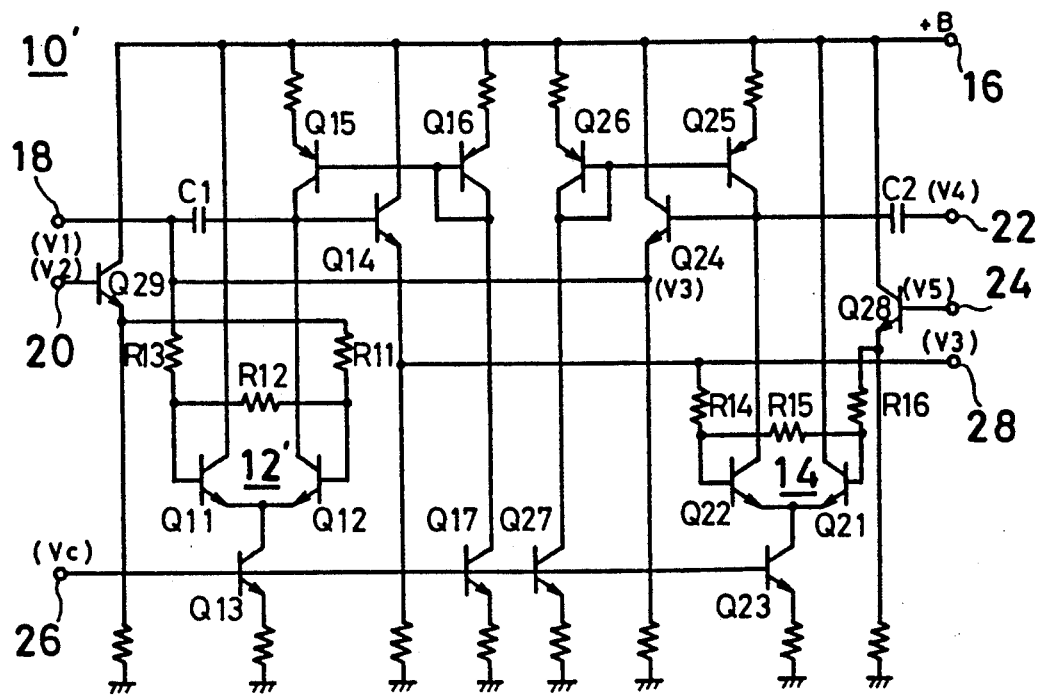
FIG. 14 is a circuit diagram showing a modified example of FIG. 13 embodiment.
Figure 15A:
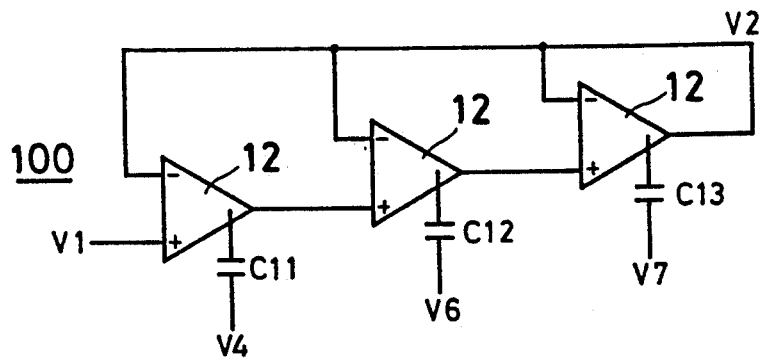
FIG. 15A to FIG. 15D are circuit diagrams respectively showing other embodiments in accordance with the present invention.
Figure 15B:
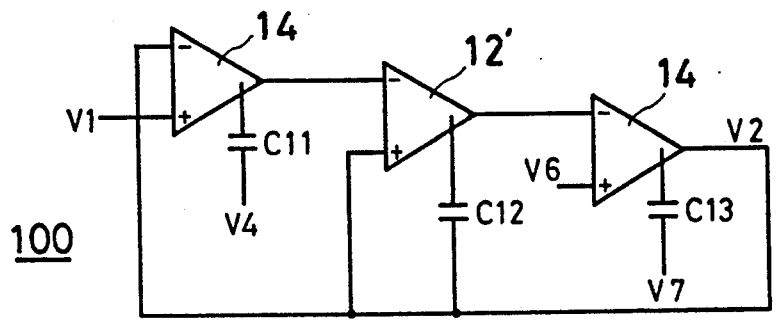
Figure 15C:
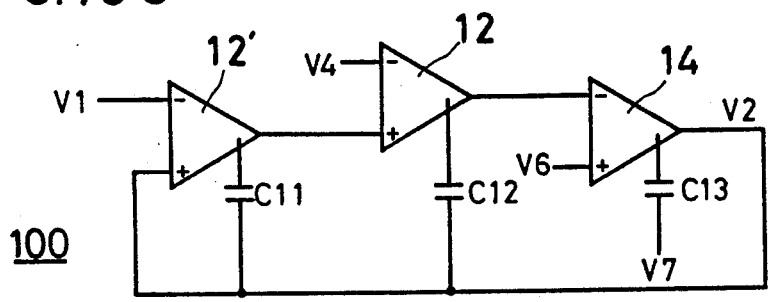
Figure 15D:
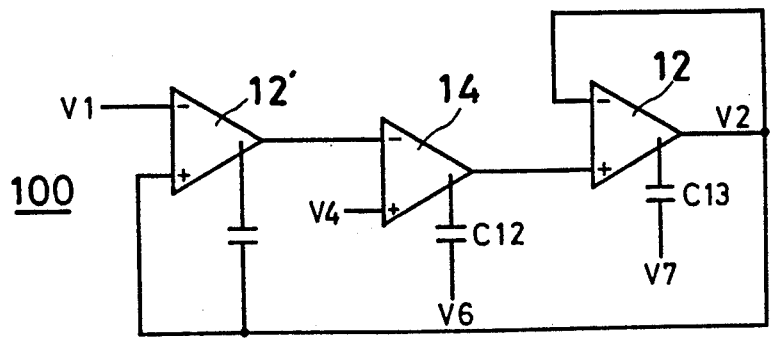

In addition, in respective embodiments shown in FIG. 14, the input (base) voltages of the transistors constituting the first differential pair 12' is applied by the voltage-dividing by means of three resistors R14 to R16, as similar to FIG. 10 embodiment, and therefore, it is possible to eliminate an influence due to a fluctuation of bias resistors of the respective transistors in FIG. 13 embodiments. However, a duplicate description will be omitted here.

All the above described embodiments are secondary active filter circuits 10 or 10'; however, the present invention is also applicable to a tertiary or more active filter circuit 100 as shown in FIG. 15A to FIG. 15D.

Active filter circuits 100 shown by FIG. 15A to FIG. 15D are specifically constructed as shown in FIG. 16A to FIG. 16D, respectively.

Figure 16A:
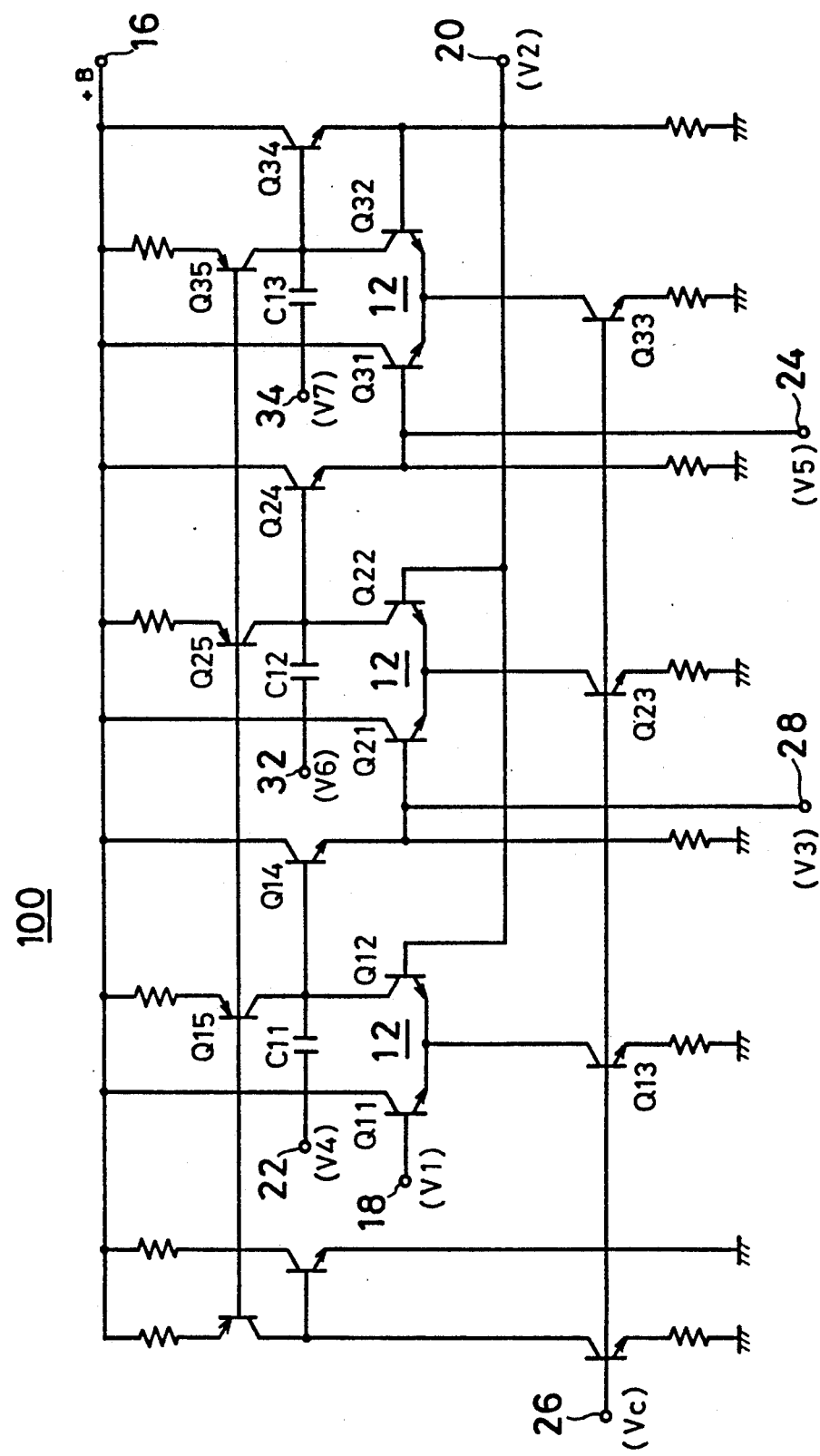
FIG. 16A to FIG. 16D are circuit diagrams respectively showing embodiments shown in FIG. 15A to FIG. 15D in detail.

In an active filter circuit 100 as shown in FIG. 16A, a current flowing respective one of the transistors Q11 and Q12 constituting the first differential pair 12 is given by the following equation (82).

$$I1 = \frac{V1 - V2}{2re1} \qquad (82)$$

A signal voltage VC11 of the capacitor C11 is given by the following equation (83).

$$VC11 = \frac{1}{j\omega C1} \cdot I1 = V3 - V4 \qquad (83)$$

The following equation (84) is obtainable by the above described equations (82) and (83).

$$\frac{V1 - V2}{2re1} \cdot \frac{1}{j\omega C11} = V3 - V4 \qquad (84)$$

Similarly, in association with the second and third differential pairs, the following equations (85) and (86) are obtained.

$$\frac{V3 - V2}{2re2} \cdot \frac{1}{j\omega C12} = V5 - V6 \qquad (85)$$

$$\frac{V5 - V2}{2re3} \cdot \frac{1}{j\omega C13} = V2 - V7 \qquad (86)$$

In accordance with the above described equations (84), (85) and (86), if the voltages V3 and V4 are eliminated while $j\omega = S$, the following equation (87) is obtained.

$$\frac{V1 - V2}{2re1} \cdot \frac{1}{SC11} + V4 - V2 = 2re2\ SC12(V2 - V6) + \qquad (87)$$
$$4re2\ re3\ S^2\ C12C13(V2 - V7)$$

$$V1 - V2 + 2re1\ SC11(V4 - V2) =$$
$$4re1\ re2\ S^2\ C11C12(V2 - V6) + 8re1\ re2\ re3\ S^3\ C11C12C13V7$$

$$V1 + 2re1SC11V2 + 4re1\ re2\ S^2\ C11C12V6 +$$
$$8re1\ re2\ re3S^3\ C11C12C13V7 = V2 + 2re1SC11V2 +$$
$$4re1\ re2\ S^2C11C12V2 + 8re1\ re2\ re3\ S^3\ C11C12C13V7$$

Now, if a signal is simultaneously input to the terminals 22 and 34 and a signal reversed in phase is simultaneously input to the terminals 18 and 32, V4=V7=Vin and V1=V6= −Vin are obtained, and thereof, a transfer function $T_{(s)}$ of the active filter circuit 100 of FIG. 16A is given by the following equation (88) which shows a tertiary phase-shifting circuit.

$$T_{(s)} = \frac{S^3 + S^2 + \frac{4re1re2C11C12}{A} + S\frac{2re1C11}{A} - \frac{1}{A}}{S^3 + S^2 + \frac{4re1re2C11C12}{A} + S\frac{2re1C11}{A} - \frac{1}{A}} \quad (88)$$

$A = 8re1\ re2\ re3\ C11C12C13$

Figure 16B:
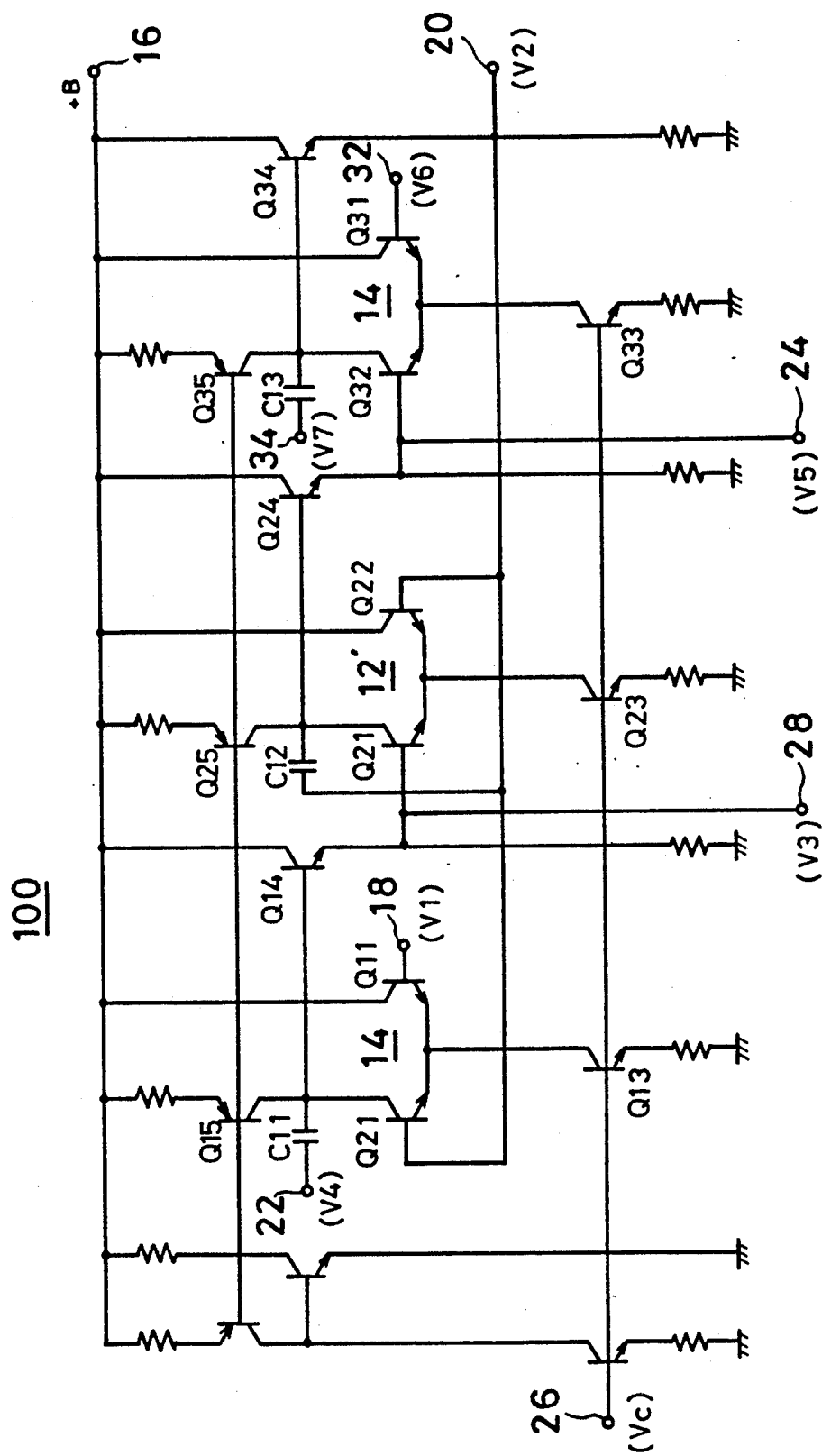
Figure 16C:
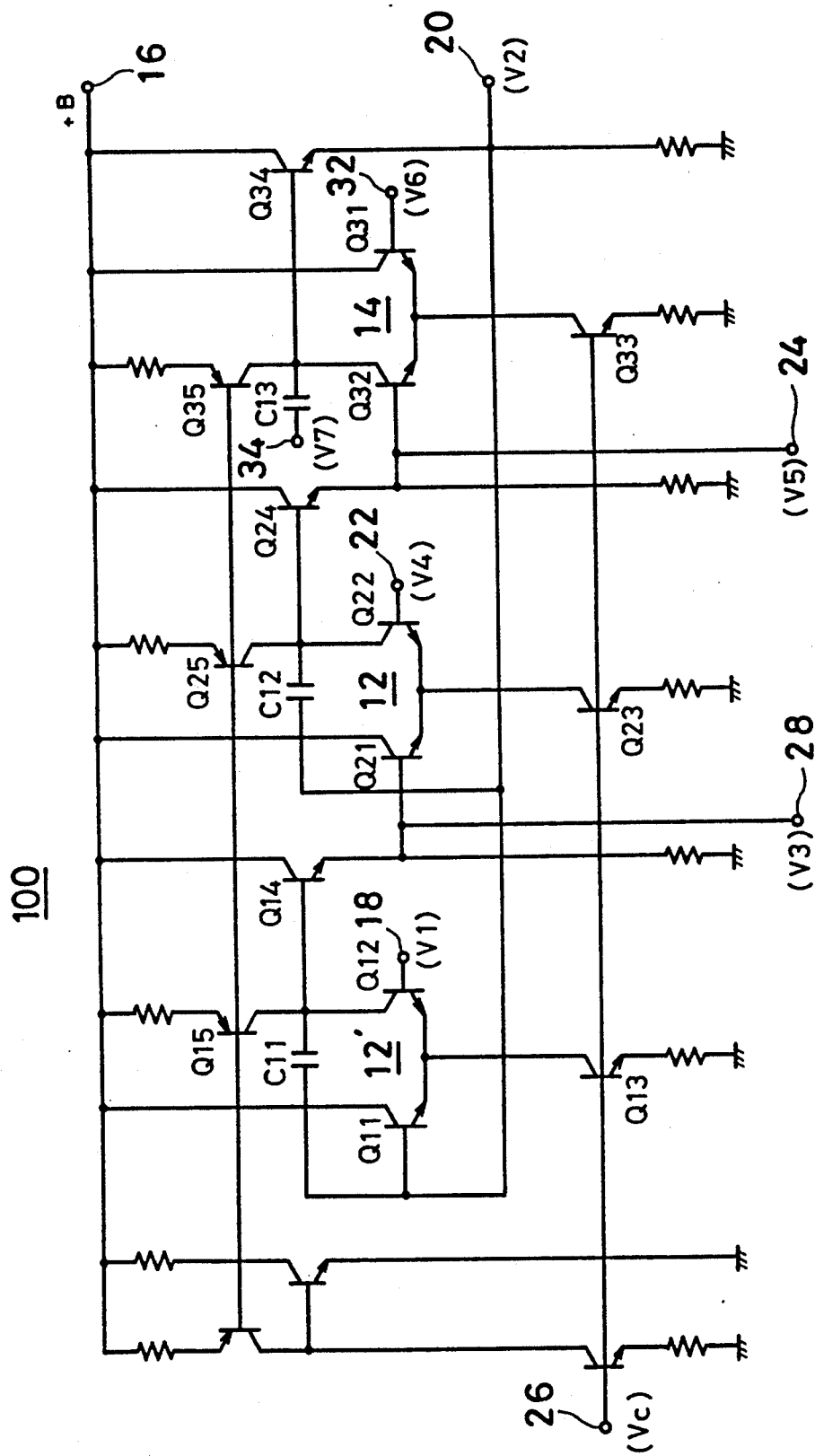
Figure 16D:
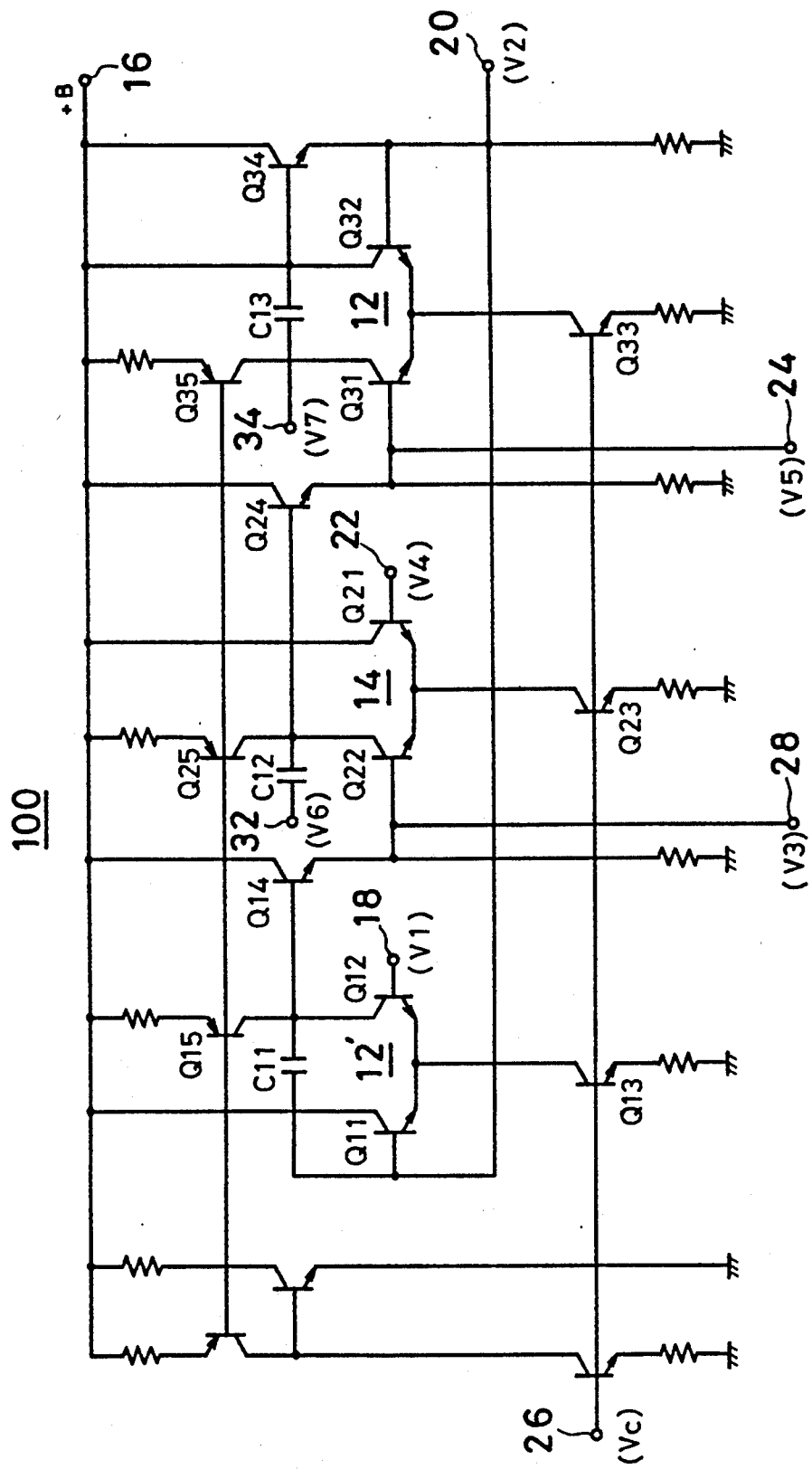

In addition, in FIG. 16B to FIG. 16D, similarly, it is possible to obtain tertiary filter circuits; however, the details thereof can be easily understood by those skilled in the art, and therefore, detail descriptions thereof are omitted here. In addition, it is needless to say that in the active filter circuit 100 shown in FIG. 16A to FIG. 16D, as similar to the previous active filter circuits 10 or 10', resistor circuits for voltage-dividing the input voltage may be added thereto.

The above described active filter circuits 10, 10' or 100 shown by FIG. 4, FIG. 6 to FIG. 14, and FIG. 16A to FIG. 16D can be utilized as follows.

FIG. 17 is a block diagram showin a PLL (phase Locked Loop) as another embodiment in accordance with the present invention, in which the active filter circuit 10, 10' or 100 is utilized as a bandpass filter 40.

In FIG. 17, an output of the bandpass filter 40 is fed-back through an amplifier 42 so that the output is in phase with an input thereof and a gain thereof becomes 1 or more, whereby an oscillator is constructed. A center frequency of the bandpass filter 40 is controlled to construct a VCO (Voltage Controlled Oscillator) 44.

If a phase between the input and output of the amplifier 42 is the same and a gain of a closed loop of the VCO 44 is 1 or more, since a phase difference between the input and the output at the center frequency of the bandpass filter 40 is 0° (in the same phase), the VCO 44 oscillates at the center frequency of the bandpass filter 40. A signal obtained by the VCO 44 is phase-compared with an input signal in a phase comparator 46.

When only a direct current voltage component is derived from a signal output from the phase-comparator 46 by a lowpass filter 48, a control voltage Vc in accordance with a phase difference between an oscillation signal of the VCO 44 and the input signal is obtained. If the control voltage Vc is fed-back to the terminal 26 shown in FIG. 4 and the like, the VCO 44 is controlled so that the output thereof has the same frequency as that of the input signal.

Thus, the VCO can be incorporated within the IC, and in a case where a plurality of different kinds of filter circuits are further incorporated within the same IC, if the control voltages Vc to be applied to the terminals 26 (FIG. 4) of the respective filters or circuits are linked with each other by adjusting a single control voltage, it is possible to adjust all the filter circuits without scattering.

Figure 19:
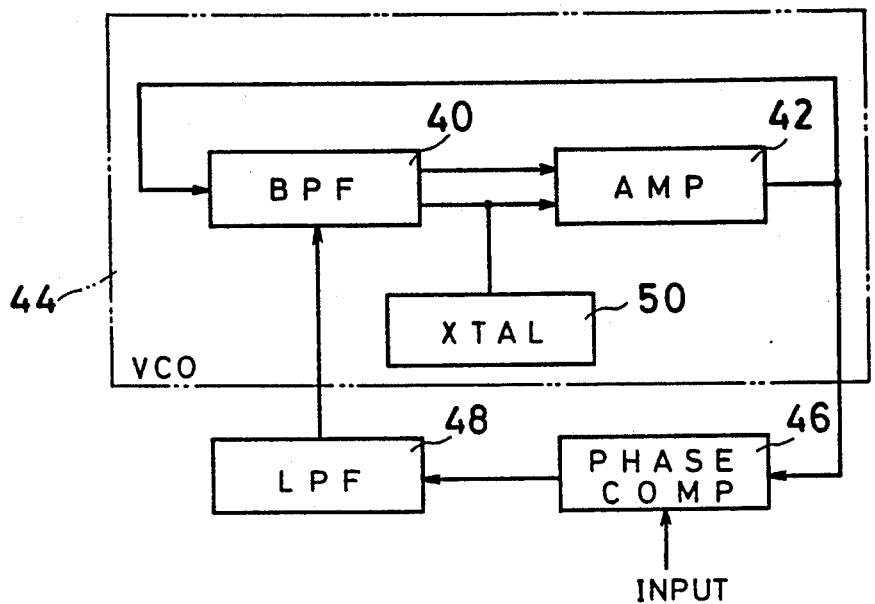

FIG. 18 and FIG. 19 are block diagrams respectively shown in embodiments to each of which a crystal filter 50 is added. The crystal filter 50 is a filter for setting a center frequency of the VCO 44.

Figure 20:
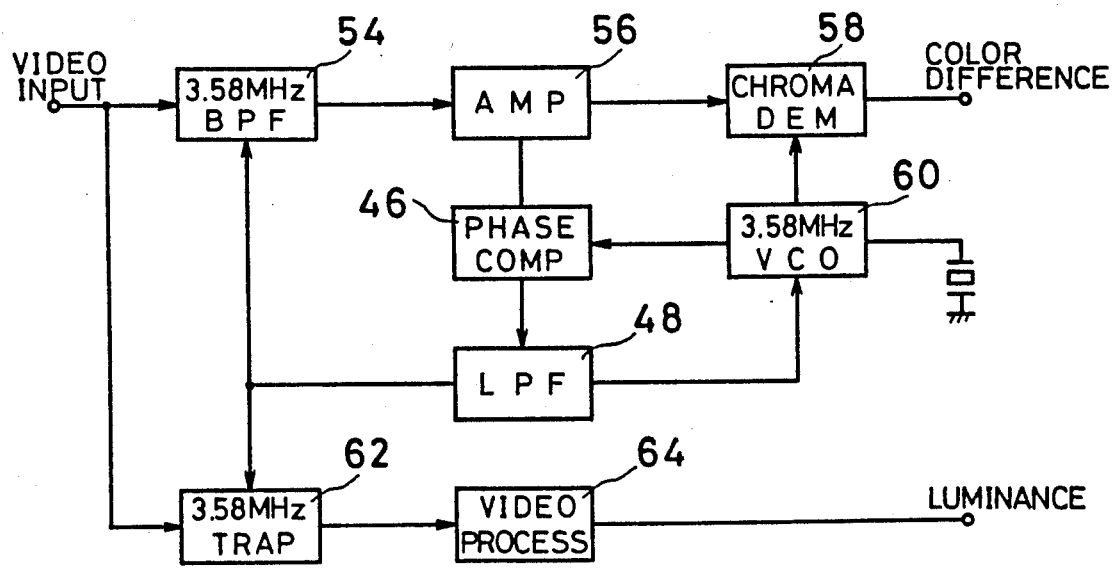
FIG. 20 is a block diagram showing a chroma circuit as another embodiment in accordance with the present invention.

FIG. 20 is a block diagram showing a chroma circuit as another embodiment in accordance with the present invention. In the NTSC standard, a video signal is input to a input terminal 52, which is input in turn to a chroma demodulation circuit 58 and a phase comparator 46 through a 3.58 MHz bandpass filter 54 and an amplifier 56. A signal output from a 3.58 MHz VCO 60 is input to the phase comparator 46 to be phase-comparated with the video signal previously input (burst). When only a direct current component is derived from a signal output from the phase-comparator 46 by the lowpass filter 48, a voltage in accordance with a phase difference between the input video signal (burst) and the output signal of the 3.58 MHz VCO 60 is output as a control voltage Vc. If the control voltage Vc is fed-back to the terminal 26 as shown in FIG. 4 and etc., a center frequency of the bandpass filter 54 becomes equal to that of the input video signal (burst), and therefore, a frequency of the output signal of the 3.58 MHz VCO 60 also becomes equal to that of the input video signal (burst). The output signal of the 3.58 MHz VCO 60 is input to the chroma demodulation circuit 58, and thus, the input video signal is demodulated and output as a color difference signal.

In addition, the video signal input to the input terminal 52 is input in turn to a video processing circuit 64 through a 3.58 MHz trap circuit 62, and the input video signal is output as a luminance signal after various kinds of video processings.

In FIG. 20 embodiment, the 3.58 MHz bandpass filter 54, a 3.58 MHz bandpass filter (not shown) within the 3.58 MHz VCO 60 and the 3.58 MHz trap circuit 62 are implemented with the same active filter circuit 10, 10' or 100 as shown in FIG. 4, and etc., and therefore, when the aforementioned control voltage Vc is applied to the control voltages of these filters or circuits, the characteristics thereof can be automatically adjusted to desired characteristics.

Figure 21:
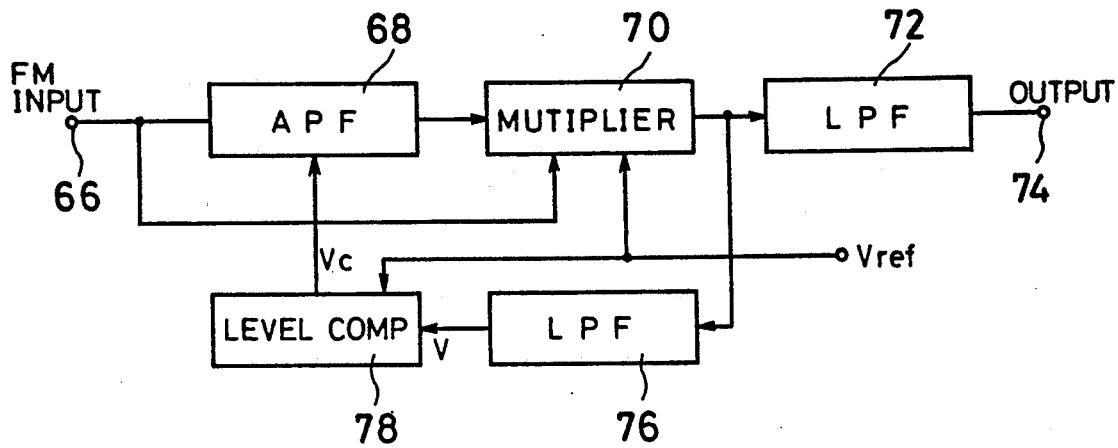
FIG. 21 is a block diagram showing a quadrature detecting circuit as another embodiment in accordance with the present invention.

FIG. 21 is a block diagram showing a circuit for automatically controlling a phase-shifting filter in a quadrature detection as another embodiment in accordance with the present invention. An FM signal input is applied to a phase-shifting filter 68 and a multiplier 70 from an input terminal 66. An output of the phase-shifting filter 68 is also applied to the multiplier 70. Then, an output of the multiplier 70 is withdrawn at an output terminal 74 through a lowpass filter 72 as a demodulated output. More specifically, in the quadrature detection, as well known, the FM signal input is multiplied with a signal being phase-shifted by the phase-shifting filter 68 in the multiplier 70 and, when a phase difference between both the signals is 90°, a reference voltage Vref is obtained and the demodulate output which is changed in a form of a so-called S-curve in which the reference voltage is a center thereof.

It is to be noted that the output of the multiplier 70 is applied to a lowpass filter 76 and an output of the lowpass filter 76 is applied to a level comparator 78. The lowpass filter 76 is a filter for deriving only a direct current voltage in accordance with a phase difference of the output from the multiplier 70 and the output thereof is applied to the level comparator 78 together with the reference voltage Vref. Then, a control voltage Vc in accordance with a level-difference between the output V of the lowpass filter 76 and the reference voltage Vref is applied to the above described phase-shifting filter 68 from the level comparator 78.

In addition, as the phase-shifting filter 68 in FIG. 21 embodiment, the active filter circuit 10, 10' or 100 as shown in FIG. 4 and etc. may be utilized.

In FIG. 21, in a case where a characteristic of the phase-shifting filter 68 is deviated from a desired characteristic and the phase difference does not become 90° at a predetermined frequency fo, only a direct current voltage component is derived from the signal output from the multiplier 70 by the lowpass filter 76, the voltage V in accordance with the such a deviation of the filter characteristic from reference voltage Vref is output as the control voltage Vc. If the control voltage Vc is fed-back to the terminal 26 as shown in FIG. 4 and etc., the phase-shifting filter 68 is automatically controlled so that an output phase difference becomes 90°.

In addition, a method for FM detection is not limited by the above described quadrature detection system, may be other arbitrary system.

Figure 22:
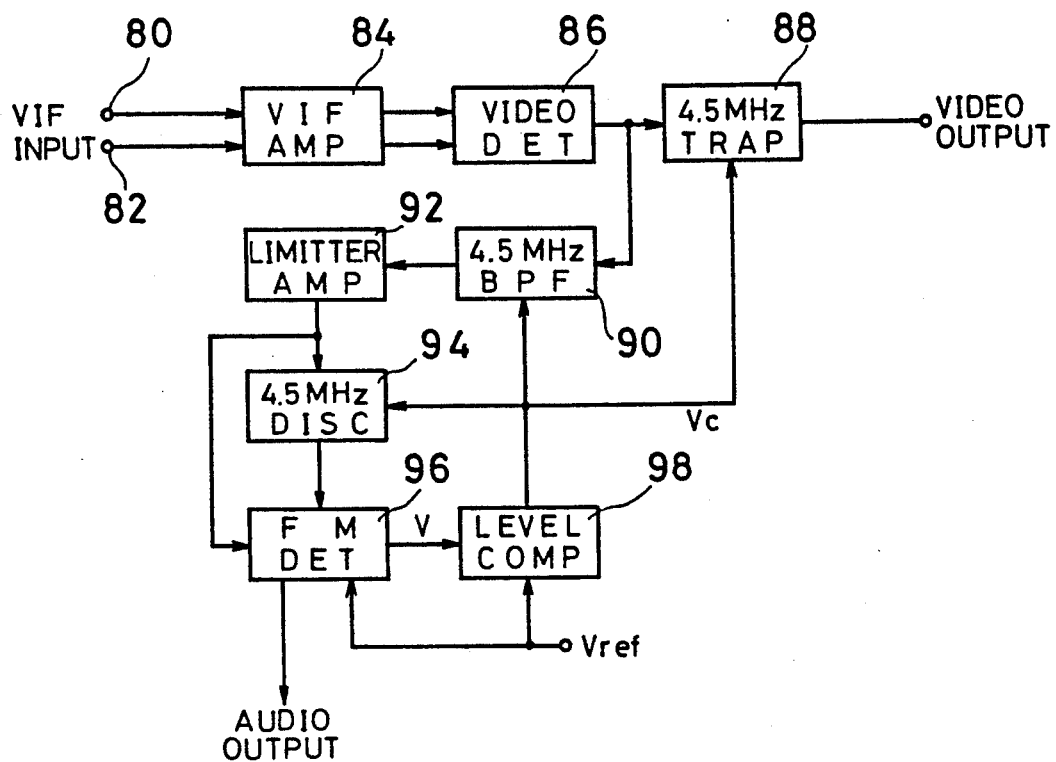
FIG. 22 is a block diagram showing a VIF and SIF circuit as another embodiment in accordance with the present invention.

FIG. 22 is a block diagram showing a VIF and SIF circuit as another embodiment in accordance with the present invention.

In a television receiver of the NTSC standard, a VIF signal is input to the input terminals 80 and 82, which is applied in turn to a video detection circuit 86 through a VIF amplifier 84. In the video detection circuit 86, the VIF signal is detected to output a video signal component which becomes a video output through a 4.5 MHz trap circuit 88.

In addition, an output of the video detection circuit 86 is applied to a 4.5 MHz bandpass filter 90 an output of which is applied to a 4.5 MHz discriminator 94 through a limitter amplifier 92. Then, an output of the 4.5 MHz discriminator 94 is applied to an FM detection circuit 96. On the other hand, an output of the limitter 92 is applied to the FM detection circuit 96 as it is. Then, an audio output as demodulated is obtained from the FM detection circuit 96.

It is noted that an output of the FM detection circuit 96 is applied to a level comparator 98 to which a reference voltage Vref is further applied.

In addition, in FIG. 22 embodiment, as the 4.5 MHz trap circuit 88, 4.5 MHz bandpass filter 90 and 4.5 MHz discriminator 94, as described in the above, the same active filter circuit 10, 10' or 100 as shown in FIG. 4, and etc. may be utilized.

Then, since an SIF signal is an FM wave, in FIG. 22, only a direct current voltage component is derived from an output signal which is detected by the FM detection circuit 96 and a voltage V is compared with the reference voltage Vref which is to be a center voltage of an originary S-curve in the level comparator 98. Therefore, in the level comparator 98, as similar to FIG. 21 embodiment, a voltage in accordance with a deviation of the characteristic of the 4.5 MHz discriminator 94 is obtained, which is applied in turn to a control input of the 4.5 MHz discriminator 94 as a control voltage Vc. Then, in this embodiment shown, since the 4.5 MHz trap circuit 88 and 4.5 MHz bandpass filter 90 are implemented with filter circuits having the same circuit configuration, the same output of the level comparator 98, that is, the control voltage Vc are applied to these circuits 88 and 90 as the control inputs therefor.

Thus, if the voltage V in accordance with the deviation of the filter characteristic of the 4.5 MHz discriminator 94 and the reference voltage Vref are compared with each other and a difference voltage is applied to the 4.5 MHz discriminator as well as the 4.5 MHz trap circuit 88 and the 4.5 MHz bandpass filter 90 as the control voltage Vc thereof, the characteristics of these filters can be adjusted or controlled uniformly.

In addition, in any of the embodiment shown in FIG. 21 and FIG. 22, the deviation of the output voltage of the S-curve of the FM detection circuit is compared with the reference voltage Vref. However, an active filter can be automatically adjusted or controlled to a desired characteristic even in the IC of the other signal without necessity of the FM detection. In such a case, a phase-shifting filter is to be provided as a dummy filter; however, it is not necessary to use a reference signal as that of the conventional circuit.

Figure 23:
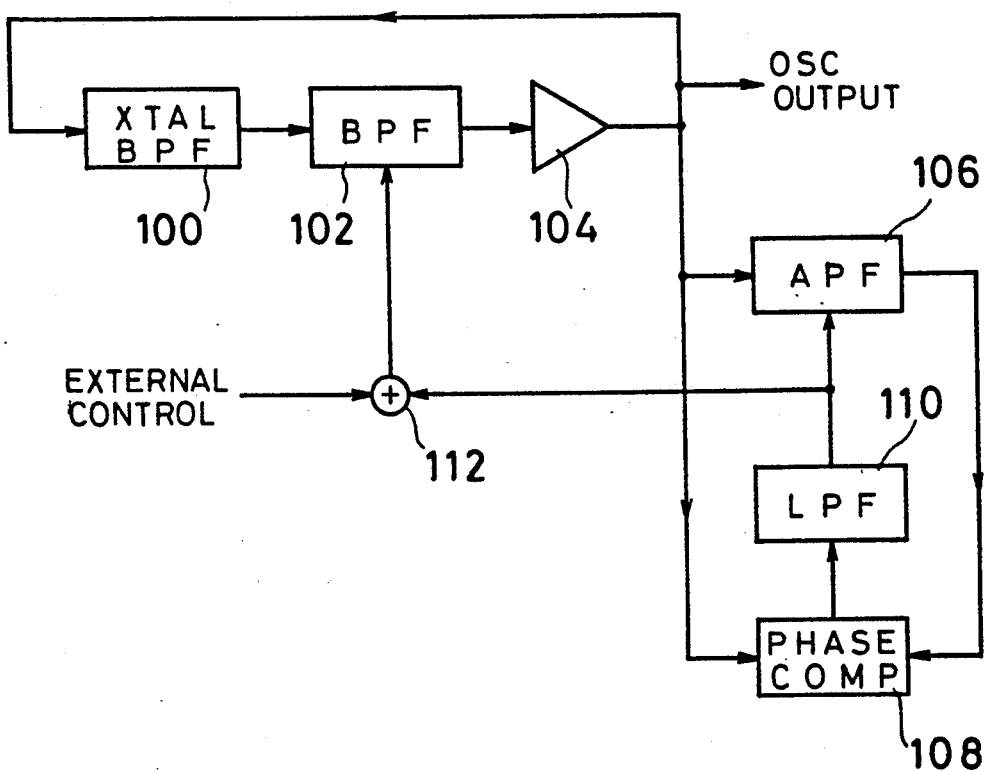
FIG. 23 is a block diagram showing an FM circuit as the other embodiment in accordance with the present invention.

FIG. 23 is a block diagram showing the other embodiment in accordance with the present invention. This embodiment shown can be utilized, for example, as an FM circuit for sound recording of a VTR. An output of a crystal bandpass filter 100 is input to a bandpass filter 102 an output of which is fed-back to the crystal bandpass filter 100 through an amplifier 104. Therefore, by these components 100, 102 and 104, a VCO as shown in FIG. 18 or 19 is constructed. An output of the VCO is applied to a phase-shifting filter 106 and a phase comparator 108. The phase-shifting filter 106 is a filter in which an amplitude is a constant irrespective to a frequency and a phase difference between the input and the output can be adjusted to zero at a resonant frequency capable of being controlled from the external. To the phase comparator 108, an output of the phase-shifting filter 106 is further applied. A signal in accordance with a phase difference between both the input signals is output from the phase comparator 108 and applied in turn to a lowpass filter 110. The lowpass filter 110 outputs a control voltage Vc in accordance with the above described phase difference, which is applied to the phase-shifting filter 106. In addition, the output of the lowpass filter 110 is also added to the control voltage from the external by an adder 112, and a voltage as added is applied to the bandpass filter 102 as a control voltage therefor.

In FIG. 23 embodiment, as the bandpass filter 102 and the phase-shifting filter 106, the active filter circuit 10, 10' or 100 as shown in FIG. 4 and etc. is utilized.

Then, when the output of the lowpass filter 110, that is, the control voltage Vc is applied to the terminal 26 (FIG. 4 and etc.) of the phase-shifting filter 106, a center frequency of the phase-sifting filter 106 is controlled delicately, resulting in zero of the phase difference between the input and output of the phase-shifting filter 106. Therefore, a resonant frequency of the phase-shifting filter 106 is always coincident with a frequency of an oscillation output from the amplifier 104.

In addition, since the bandpass filter 102 is constructed by the same active filter circuit as that of the phase-shifting filter 106, by feeding-back the output voltage of the lowpass filter 100 to the bandpass filter 102 through the adder 112, a resonant frequency of the bandpass filter 102 is also coincident with an oscillation frequency of the VCO. Then, at that frequency, the phase difference between the input and output of the bandpass filter 102 becomes zero, and therefore, the oscillation frequency of the VCO becomes a resonant frequency of a crystal (not shown) of the crystal bandpass filter 100, and therefore, no harmonic component is included in the oscillation frequency.

Then, by adding an external signal having a frequency sufficiently higher than a cut-off frequency of the lowpass filter 110 to the output voltage of the lowpass filter 110 and applying the same to the bandpass filter 102, a center frequency of the bandpass filter 102 is changed in accordance with the external signal, and therefore, the oscillation output of the VCO can be frequency-modulated by the external control signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An active filter circuit, comprising:
a first differential pair constructed to include first and second transistors;
a first capacitive load connected to a collector of said second transistor of said first differential pair;
a first negative feed-back transistor for feeding-back an output at said collector of said second transistor to a base of said second transistor;
a second differential pair constructed to include third and fourth transistors;
a second capacitive load connected to a collector of said fourth transistor of said second differential pair;
a second negative feed-back transistor for feeding-back an output at said collector of said fourth transistor to a base of said first transistor constituting said first differential pair;
fifth and sixth transistors for forming a first current mirror circuit which is connected to said collector of said second transistor;
seventh and eighth transistors for forming a second current mirror circuit which is connected to said collector of said fourth transistor; and
biasing means formed in association with at least one of said first and second differential pairs for applying bias voltage to bases of two transistors constituting said at least one of the differential pairs, said biasing means including resistor voltage-dividing means for applying a divided voltage to respective bases of said two transistors as said bias voltages.

2. An active filter circuit, comprising:
a first differential pair constructed to include first and second transistors;
a first capacitive load connected to a collector of said second transistor of said first differential pair;
a second differential pair constructed to include third and fourth transistors;
a fifth transistor for supplying an output at said collector of said second transistor of said first differential pair to a base of said fourth transistor of said second differential pair;
a second capacitive load connected to said collector of said fourth transistor;
a negative feed-back transistor for feeding-back an output at said collector of said fourth transistor to a base of said first transistor constituting said first differential pair;
sixth and seventh transistors for forming a first current mirror circuit which is connected to said collector of said second transistor;
eighth and ninth transistors for forming a current mirror circuit which is connected to said collector of said fourth transistor; and
biasing means formed in association with at least one of said first and second differential pairs for applying bias voltages to bases of two transistors constituting said at least one of the differential pairs, said biasing means including resistor voltage-dividing means for applying a divided voltage to respective bases of said two transistors as said bias voltages.

3. An active filter circuit in accordance with claim 1 or 2, further comprising current changing means for correlatively changing circuit amounts of said first and second differential pairs in response to a given control voltage.

4. An active filter circuit in accordance with claim 1, wherein said resistor voltage-dividing means includes a first resistor series connection having a series connecting point connected to the base of one of said two transistors, and a second resistor series connection having a series connecting point connected to the base of another of said two transistors.

5. An active filter circuit in accordance with claim 4, wherein said biasing means includes a bias voltage source, and respective one ends of the two resistor series connections are connected to said bias voltage source.

6. An active filter circuit in accordance with claim 4, wherein said first and second resistor series connections include a common resistor which is interconnected between the bases of said two transistors.

7. A filter controlling circuit, comprising:
a filter for receiving an input and for outputting an output with a phase characteristic, said phase characteristic of said filter changing in accordance with a control voltage;
means, coupled to said filter, for outputting a direct current voltage component having a level based on said phase characteristic of said output of said filter;
level comparing means for comparing said level of said direct current voltage component with a reference voltage; and
means for applying said control voltage to said filter based upon an output of said level comparing means.

8. A filter controlling circuit in accordance with claim 7, wherein said filter includes:
a first differential pair constructed to include a first and second transistors;
a first capacitive load connected to an output of said second transistor of said first differential pair;
a first negative feed-back path for feeding-back an output of said second transistor to an input thereof;
a second differential pair constructed to include a third and fourth transistors;
a second capacitive load connected to an output of said fourth transistor of said second differential pair;
a second negative feed-back path for feeding-back an output of said fourth transistor to an input of said first transistor constituting the first differential pair; and
current changing means for correlatively changing current amounts of said first and second differential pairs in response to said control voltage.

9. A filter controlling circuit in accordance with claim 7, wherein said filter include:
a first differential pair constructed to include a first and second transistors;
a first capacitive load connected to an output of said second transistor of said first differential pair;
a second differential pair constructed to include a third and fourth transistors;
a connecting path for connecting an output of said second transistor of said first differential pair to an input of said fourth transistor of said second differential pair;
a second capacitive load connected to an output of said fourth transistor;
a negative feed-back path for feeding-back an output of said fourth transistor to an input of said first transistor constituting said first differential pair; and current changing means for correlatively changing current amounts of said first and second differential pairs in response to said control voltage.

10. A filter controlling circuit comprising:
a filter, a center frequency of said filter being able to be changed in accordance with a control voltage;
amplifying means having a gain of 1 or more for feeding-back an output of said filter to an input of said filter;
phase comparing means receiving the output of said filter and a further input signal; and
means for applying said control voltage to said filter based upon an output of said phase comparing means, wherein said filter includes,
a first differential pair constructed to include first and second transistors;
a first capacitive load connected to a collector of said second transistor of said first differential pair;
a first negative feed-back path for feeding-back an output at said collector of said second transistor to a base of said second transistor;
a second differential pair constructed to include third and fourth transistors;
a second capacitive load connected to a collector of said fourth transistor of said second differential pair;
a second negative feed-back path for feeding-back an output at said collector of said fourth transistor to a base of said first transistor constituting said first differential pair;
current changing means for correlatively changing current amounts of said first and second differential pairs in response to said control voltage; and
biasing means formed in association with at least one of said first and second differential pairs for applying bias voltages to bases of two transistors constituting said at least one of the differential pairs, said biasing means including resistor voltage-dividing means or applying a divided voltage to respective bases of said two transistors as said bias voltages.

11. A filter controlling circuit comprising:
a filter, a center frequency of said filter being able to be changed in accordance with a control voltage;
amplifying means having a gain of 1 or more for feeding-back an output of said filter to an input of said filter;
phase comparing means receiving the output of said filter and a further input signal; and
means for applying said control voltage to said filter based upon an output of said phase comparing means, wherein said filter includes,
a first differential pair constructed to include first and second transistors;
a first capacitive load connected to a collector of said second transistors of said first differential pair;
a second differential pair constructed to include third and fourth transistors;
a connecting path for connecting said collector of said second transistor of said first differential pair to a base of said fourth transistor of said second differential pair;
a second capacitive load connected to said collector of said fourth transistor;
a negative feed-back path for feeding-back said collector of said fourth transistor to a base of said first transistor constituting said first differential pair;
current changing means for correlatively changing current amounts of said first and second differential pairs in response to said control voltage; and
biasing means formed in association with at least one of said first and second differential pairs for applying bias voltages to bases of two transistors constituting said at least one of the differential pairs, said biasing means including resistor voltage-dividing means for applying a divided voltage to respective bases of said two transistors as said bias voltages.

12. A filter controlling circuit in accordance with claim 7, wherein said filter includes:
a first differential pair constructed to include first and second transistors;
a first capacitive load connected to an output of said second transistor of said first differential pair;
a first negative feed-back path for feeding-back an output of said second transistor to an input thereof;
a second differential pair constructed to include third and fourth transistors;
a second capacitor load connected to an output of said fourth transistor of said second differential pair;
a second negative feed-back path for feeding-back an output of said fourth transistor to an input of said first transistor constituting the first differential pair;
current changing means for correlatively changing current amounts of said first and second differential pairs in response to said control voltage; and
biasing means formed in association with at least one of said first and second differential pairs for applying bias voltages to bases of two transistors constituting said at least one of the differential pairs, said biasing means including resistor voltage-dividing means for applying a divided voltage to respective bases of said two transistors as said bias voltages.

13. A filter controlling circuit in accordance with claim 7, wherein said filter includes:
a first differential pair constructed to include first and second transistors;
a first capacitive load connected to an output of said second transistor of said first differential pair;
a second differential pair constructed to include third and fourth transistors;
a connecting path for connecting an output of said second transistor of said first differential pair to an input of said fourth transistor of said second differential pair;
a second capacitive load connected to an output of said fourth transistor;
a negative feed-back path for feeding-back an output of said fourth transistor to an input of said first transistor constituting said first differential pair;
current changing means for correlatively changing current amounts of said first and second differential pairs in response to said control voltage; and
biasing means formed in association with at least one of said first and second differential pairs for applying bias voltages to bases of two transistors constituting said at least one of the differential pairs, said biasing means including resistor voltage-dividing means for applying a divided voltage to respective bases of said two transistors as said bias voltage.

14. An active filter circuit in accordance with claim 2, wherein said resistor voltage-dividing means includes a first resistor series connection having a series connecting point connected to the base of one of said two transistors, and a second resistor series connection having a series connecting point connected to the base of another of said two transistors.

15. An active filter circuit, comprising:
a first differential pair constructed to include first and second transistors;
a first capacitive load connected to a collector of said second transistor of said first differential pair;
a first negative feed-back transistor for feeding-back an output at said collector of said second transistor to a base of said second transistor;
a second differential pair constructed to include third and fourth transistors;
a second capacitive load connected to a collector of said fourth transistor of said second differential pair;
a second negative feed-back transistor for feeding-back an output at said collector of said fourth transistor to a base of said first transistor constituting said first differential pair;
fifth and sixth transistors for forming a first current mirror circuit which is connected to said collector of said second transistor; and
seventh and eighth transistors for forming a second current mirror circuit which is connected to said collector of said fourth transistor.

16. An active filter circuit according to claim 15, further comprising a third current mirror circuit for determining currents of said first current mirror circuit, said second current mirror circuit, said first differential pair and said second differential pair.

17. An active filter circuit according to claim 16, further comprising a terminal for inputting a control signal, a current of said third current mirror circuit being controlled by said control signal such that a filter characteristic of said active filter can be changed.

18. An active filter circuit, comprising:
a first differential pair constructed to include first and second transistors;
a first capacitive load connected to a collector of said second transistor of said first differential pair;
a second differential pair constructed to include third and fourth transistors;
a fifth transistor for supplying an output at said collector of said second transistor of said first differential pair to a base of said fourth transistor of said second differential pair;
a second capacitive load connected to a collector of said fourth transistor;
a negative feed-back transistor for feeding-back an output at said collector of said fourth transistor to a base of said first transistor constituting said first differential pair;
sixth and seventh transistors for forming a current mirror circuit which is connected to said collector of said second transistor; and
eighth and ninth transistors for forming a current mirror circuit which is connected to said collector of said fourth transistor.

19. An active filter circuit according to claim 18, further comprising a third current mirror circuit for determining currents of said first current mirror circuit, said second current mirror circuit, said first differential pair and said second differential pair.

20. An active filter circuit according to claim 19, further comprising a terminal for inputting a control signal, a current of said third mirror circuit being controlled by said control signal such that a filter characteristic of said active filter circuit can be changed.

21. A filter controlling circuit as claimed in claim 7 wherein said means for outputting a direct current voltage component includes a multiplier and a low-pass filter.

* * * * *